(12) United States Patent
Tsuyuno et al.

(10) Patent No.: US 10,068,880 B2
(45) Date of Patent: Sep. 4, 2018

(54) POWER MODULE

(71) Applicant: Hitachi Automotive Systems, Ltd., Hitachinaka-shi, Ibaraki (JP)

(72) Inventors: Nobutake Tsuyuno, Tokyo (JP); Junpei Kusukawa, Tokyo (JP); Takeshi Tokuyama, Tokyo (JP); Tokihito Suwa, Ibaraki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/500,138

(22) PCT Filed: Jun. 8, 2015

(86) PCT No.: PCT/JP2015/066427
§ 371 (c)(1),
(2) Date: Jan. 30, 2017

(87) PCT Pub. No.: WO2016/038955
PCT Pub. Date: Mar. 17, 2016

(65) Prior Publication Data
US 2018/0211938 A1  Jul. 26, 2018

(30) Foreign Application Priority Data

Sep. 9, 2014  (JP) .................................. 2014-182843

(51) Int. Cl.
*H01L 25/07* (2006.01)
*H01L 23/367* (2006.01)
(Continued)

(52) U.S. Cl.
CPC ........ *H01L 25/072* (2013.01); *H01L 23/3677* (2013.01); *H01L 23/3735* (2013.01);
(Continued)

(58) Field of Classification Search
CPC ............. H01L 27/0761; H01L 27/0248; H01L 29/1004; H01L 23/4093; H01L 23/42
See application file for complete search history.

(56) References Cited

U.S. PATENT DOCUMENTS 6,200,407 B1 * 3/2001 Wieloch ................. H05K 1/021
156/252

FOREIGN PATENT DOCUMENTS

| JP | 2000-31325 A | 1/2000 |
| JP | 2007-49810 A | 2/2007 |
| JP | 2012-244750 A | 12/2012 |

OTHER PUBLICATIONS

International Search Report (PCT/ISA/210) issued in PCT Application No. PCT/JP2015/066427 dated Sep. 8, 2015 with English translation (Two (2) pages).
(Continued)

*Primary Examiner* — Quoc Hoang
(74) *Attorney, Agent, or Firm* — Crowell & Moring LLP

(57) ABSTRACT

It is an object of the present invention to provide a power module which can withstand a high voltage with a thin insulating layer. A power module of the present invention is provided with a first power semiconductor element 328 of an upper arm side constituting an inverter circuit, a second power semiconductor element 330 of a lower arm side, a first conductor part 320 which transmits an alternating current, a second conductor part 315 which transmits a direct current, an electrically-conductive heat dissipating part 307, a first intermediate conductor layer 910 disposed between the first conductor part 320 and the heat dissipating part 307 via an insulating layer 900, and a second intermediate conductor layer 911 disposed between the second conductor part 315 and the heat dissipating part 307 via the insulating layer 900, wherein, the second intermediate conductor layer 911 is formed to be separated from the first intermediate (Continued)

conductor layer 910, and the first intermediate conductor layer 910 forms a capacity circuit which shares the voltage between the first conductor part 320 and the heat dissipating part 307.

14 Claims, 25 Drawing Sheets

(51) Int. Cl.
    *H02M 7/537*     (2006.01)
    *H01L 23/495*     (2006.01)
    *H02M 7/00*     (2006.01)
    *H01L 23/373*     (2006.01)

(52) U.S. Cl.
    CPC ...... *H01L 23/49575* (2013.01); *H02M 7/003* (2013.01); *H02M 7/537* (2013.01)

(56) References Cited

OTHER PUBLICATIONS

Japanese-language Written Opinion (PCT/ISA/237) issued in PCT Application No. PCT/JP2015/066427 dated Sep. 8, 2015 (Three (3) pages).

\* cited by examiner

POWER MODULE

TECHNICAL FIELD

The present invention relates to a power module in which power semiconductor elements are made into a module and particularly relates to a power module to be mounted in a vehicle.

BACKGROUND ART

Since electric-power converting devices using switching of power semiconductor elements have high conversion efficiency, the electric-power converting devices are widely utilized for commercial uses, mounting in cars, railroads, electric transformation equipment, etc. Since this power semiconductor element generates heat when electricity is distributed, high heat dissipation performance is required. Normally, in heat dissipation, a metal-made heat dissipating structure having fins is used, and it is grounded to the ground (GND) in order to stabilize electric potentials and to prevent electric shock. Therefore, an insulating material disposed between the power semiconductor element and the heat dissipating structure is required to have excellent thermal conductivity. However, if the voltage to be converted is high, the insulating material has to be formed to be thick in order to improve insulating performance, and heat dissipation performance is deteriorated.

As a method of improving the heat dissipation performance, a method of sandwiching a conductor, which is a highly thermally conductive material, between an insulating layer and an insulating layer for example as shown in PTL 1 is known.

CITATION LIST

Patent Literature

PTL 1: JP 2012-244750 A

SUMMARY OF INVENTION

Technical Problem

The power module described in PTL 1 is capable of improving heat dissipation performance by providing a metal plate between a first insulating material and a second insulating material, but cannot reduce the total thickness of the insulating materials of the first insulating material and the second insulating material together.

An object of the present invention is to provide a power module having excellent heat dissipation performance while satisfying high insulating performance by reducing the total thickness of the insulating layers.

Solution to Problem

A power module according to the present invention includes: a first power semiconductor element of an upper arm side constituting an inverter circuit configured to convert a direct current to an alternating current; a second power semiconductor element of a lower arm side constituting the inverter circuit; a first conductor part electrically connected to the first power semiconductor element and configured to transmit the alternating current; a second conductor part electrically connected to the second power semiconductor element and configured to transmit the direct current; an electrically-conductive heat dissipating part disposed in an opposite side of the first power semiconductor element and the second power semiconductor element with the first conductor part and the second conductor part interposed therebetween; a first intermediate conductor layer disposed between the first conductor part and the heat dissipating part via an insulating layer; and a second intermediate conductor layer disposed between the second conductor part and the heat dissipating part via an insulating layer, wherein the second intermediate conductor layer is formed to be separated from the first intermediate conductor layer, and the first intermediate conductor layer forms a capacity circuit that shares a voltage between the first conductor part and the heat dissipating part.

Advantageous Effects of Invention

According to the present invention, the total thickness of the insulating layer can be reduced, and the power module is enabled to dissipate heat more. Therefore, an electric-power converting device can be downsized.

DESCRIPTION OF EMBODIMENTS

Figure 1:
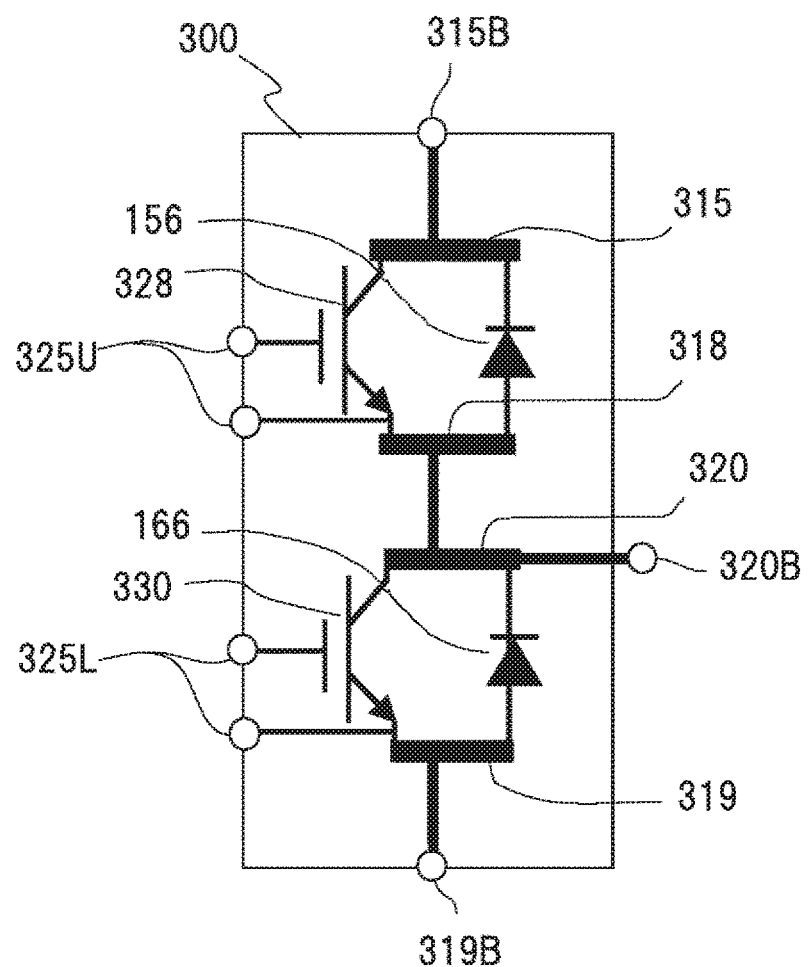
FIG. 1 is a circuit diagram of a power module of a first embodiment.

Hereinafter, embodiments of power modules according to the present invention will be described with reference to drawings. Note that the same elements in the drawings will be denoted by the same reference signs, and redundant descriptions will be omitted.

First, a configuration of a power module according to a first embodiment will be described by using FIG. 1 to FIG. 3.

FIG. 1 is a circuit configuration diagram of a power module 300 of the present embodiment. The power module 300 includes an IGBT 328 and a diode 156, which constitute an upper arm circuit, and an IGBT 330 and a diode 166, which constitute a lower arm circuit. Herein, IGBT is an abbreviation of an insulated-gate-type bipolar transistor. A circuit which is connected to a positive electrode side of a battery and creates alternating-current waveforms by switching of a power semiconductor element is an upper arm circuit, and a circuit which is connected to a negative electrode side or GND side of the battery and creates alternating-current waveforms is a lower arm circuit. When neutral grounding is to be carried out, the lower arm circuit is connected to a negative electrode side of a capacitor instead of GND.

The power module 300 is provided with conductor plates 315, 318, 320, and 319. The conductor plate 315 is connected to a collector side of the IGBT 328 of the upper arm side. The conductor plate 318 is connected to an emitter side of the IGBT 328 of the upper arm side. The conductor plate 320 is connected to a collector side of the IGBT 330 of the lower arm side. The conductor plate conductor plate 319 is connected to an emitter side of the IGBT 330 of the lower arm side.

The power module 300 is provided with terminals 315B, 319B, 320B, 325U, and 325L. The terminal 315B is connected to the conductor plate 315. The terminal 315B is connected to a positive electrode side of a direct-current battery or a smoothing capacitor. The terminal 319B is connected to the conductor plate 319. The terminal 319B is connected to a negative electrode side of the direct-current battery or the smoothing capacitor or to ground (GND). The terminal 320B is connected to the conductor plate 320. The terminal 320B is connected to a motor. The terminals 325U are control terminals of the IGBT 328 of the upper arm side. The terminals 325L are control terminals of the IGBT 325 of the lower arm side.

The conductor plate 315 connected to the terminal 315B transmits direct currents. The conductor plate 319 connected to the terminal 319B transmits direct currents. The conductor plate 320 connected to the terminal 320B transmits alternating currents.

Figure 2:
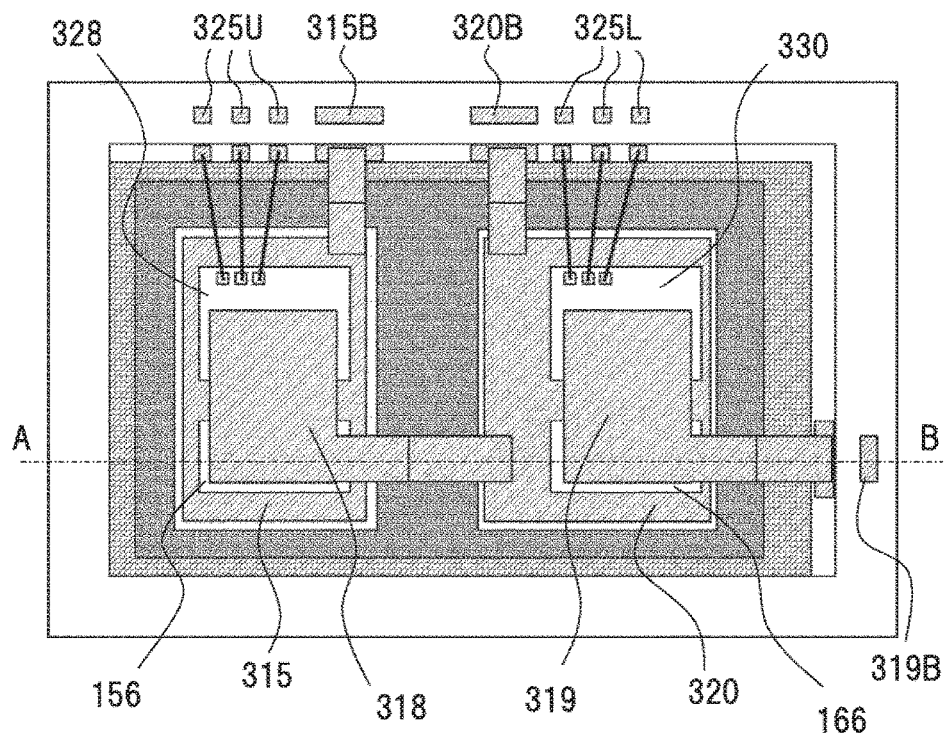
FIG. 2 is a plan view of the power module of the first embodiment.

FIG. 2 is a plan view showing a structure of the power module 300 of the present embodiment. The IBGT 328 and the IGBT 330 are disposed so that emitter surfaces thereof are directed to the same direction.

Figure 3:
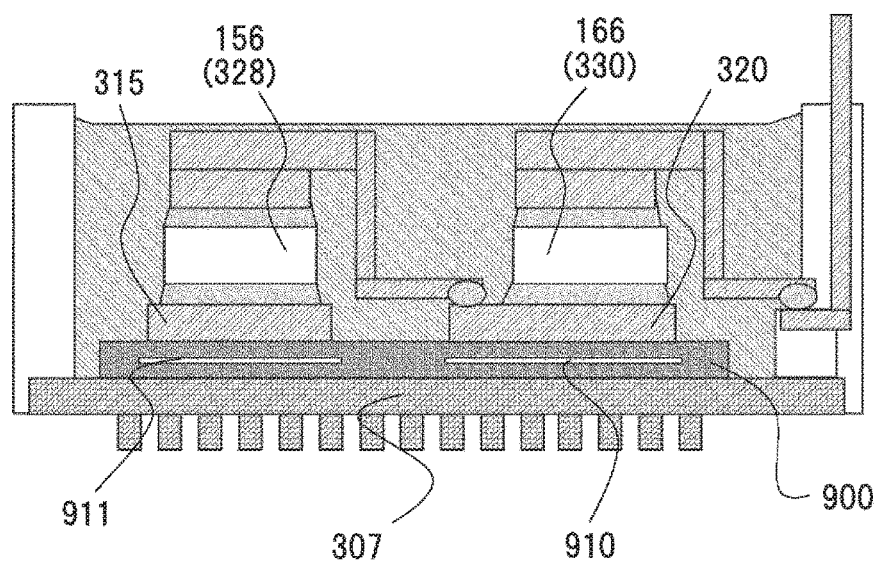
FIG. 3 is a cross-sectional view of the power module of FIG. 2 sectioned by a cross section A-B.

FIG. 3 is a cross-sectional view of the power module 300 of FIG. 2 sectioned by a cross section A-B. The power module 300 has a heat dissipating surface 307 on which fins for heat dissipation are formed. The heat dissipating surface 307 is disposed in the opposite side of the IGBTs 328 and 330 and the diodes 156 and 166 with the conductor plate 320 and the conductor plate 315 interposed therebetween. The heat dissipating surface 307 is formed by an electrically-conductive member and is grounded to GND for voltage stabilization.

Moreover, the power module 300 has an intermediate conductor 910 and an intermediate conductor 911. The intermediate conductor 910 is disposed between the conductor plate 320 and the heat dissipating surface 307. The intermediate conductor 911 is disposed between the conductor plate 315 and the heat dissipating surface 307. An insulating layer 900 is formed between the intermediate conductor 910 and the conductor plate 320, between the intermediate conductor 910 and the heat dissipating surface 307, between the intermediate conductor 911 and the conductor plate 315, and between the intermediate conductor 911 and the heat dissipating surface 307.

In the power module of the present embodiment, if projection is carried out along the arrangement direction of the conductor plate 320 and the intermediate conductor 910, the intermediate conductor 910 is formed so that a projected part of the conductor plate 320 includes a projected part of the intermediate conductor 910. Meanwhile, if projection is carried out along the arrangement direction of the conductor plate 315 and the intermediate conductor 911, the intermediate conductor 911 is formed so that a projected part of the conductor plate 319 includes a projected part of the intermediate conductor 911.

The structure in which two arm circuits, i.e., the upper arm circuit and the lower arm circuit are integrally made into a module like the power module of the present embodiment is referred to as a 2-in-1 structure. The 2-in-1 structure can reduce the number of output terminals compared with a 1-in-1 structure in which each single arm circuit is made into a module. The example of the 2-in-1 structure is shown in the present embodiment. However, the number of terminals can be further reduced by, for example, a 3-in-1 structure, a 4-in-1 structure, or a 6-in-1 structure. In the power module of the 2-in-1 structure, by juxtaposing the upper arm circuit and the lower arm circuit and disposing them to be opposed to a metal flat plate via an insulating layer, the inductance of the circuits can be reduced by magnetic-field cancelling-out effects.

The power module of the present embodiment provides the intermediate conductor 910, thereby causing the voltage between the conductor plate 320 and the heat dissipating surface 307 to be shared between the conductor plate 320 and the intermediate conductor 910 and between the intermediate conductor 910 and the heat dissipating surface 307. By virtue of this, the power module of the present embodiment can reduce the insulating layer thickness while satisfying insulating performance. Principles thereof will be described below by using FIG. 4 to FIG. 13.

Figure 4:
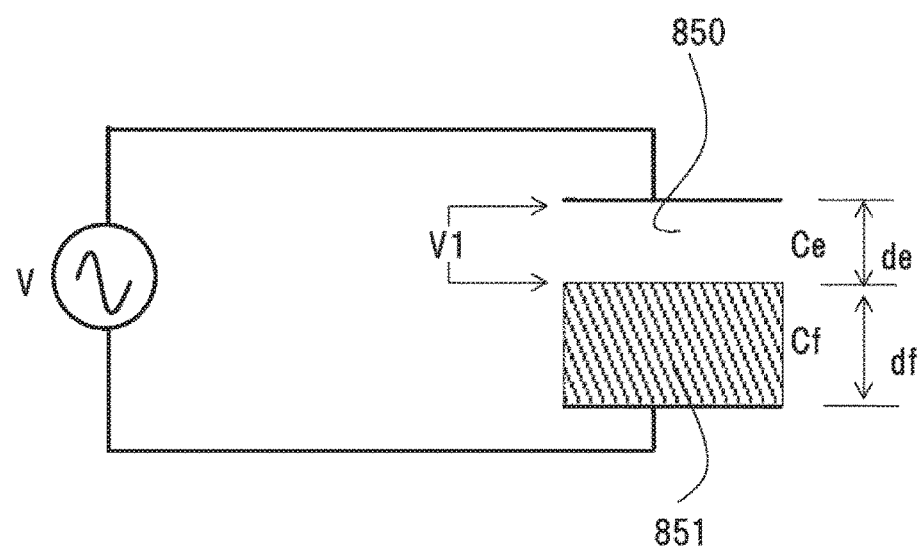
FIG. 4 shows a model of voltage sharing in a case in which an air layer is present between an insulating layer and an electrode.

FIG. 4 is a diagram showing a model of voltage sharing in a case in which an air layer is present between an insulating layer and an electrode. An air layer 850 and an insulating layer 851 are formed between electrodes. A voltage V is expressed by a following expression, wherein an alternating-current voltage applied to the entirety between the electrodes is assumed to be V, and the voltage therein that is applied to the air layer is assumed to be $V_1$. However, $C_e$ represents the capacity of the air layer, $C_f$ represents the capacity of the insulating layer, $\varepsilon_0$ represents the permittivity of vacuum, $\varepsilon$ represents relative permittivity of the insulating layer, S represents an electrode area, $d_e$ represents the thickness of the air layer, $d_f$ represents the thickness of the insulating layer.

$$V = V_1 \cdot (C_e + C_f)/C_f = V_1 \cdot (d_f/(\varepsilon \cdot d_e) + 1) \quad \text{(Mathematical Expression 1)}$$

$$C_e = \varepsilon_0 \cdot S/d_e \quad \text{(Mathematical Expression 2)}$$

$$C_f = \varepsilon_0 \cdot \varepsilon \cdot S/d_f \quad \text{(Mathematical Expression 3)}$$

If a void or an air layer due to exfoliation is generated between the electrode and the insulating layer or in the insulating layer, partial discharge occurs when a high voltage is applied to the electrodes. When the insulating layer is exposed to an environment in which partial discharge always occurs, the insulating layer is eroded by sparks caused by the discharge, and endurance time thereof is significantly reduced. Particularly, an insulator made of resin has low heat resistance compared with ceramics, and the influence thereof becomes notable. Usage under the condition in which partial discharge does not occur is effective for improving insulating performance.

Meanwhile, discharge phenomena are different between that of direct-current voltages and that of alternating-current voltages. If an insulating layer is present between electrodes under a direct-current voltage, even if there is a condition in which partial discharge occurs, the insulating layer is electrified and reduces the electric field of space after discharge occurs one time, and, therefore, discharge is stopped. Therefore, since the voltage is discharged only one time, the influence of the discharge on deterioration of the insulating layer is small. On the other hand, under an alternating-current voltage, since the voltage applied to the insulating layer is inverted as time elapses, discharge is repeated. Therefore, the influence of the discharge on deterioration of the insulating layer is large. Furthermore, if alternating-current waveforms are to be generated by switching of a power semiconductor element, since a surge voltage is superimposed on alternating-current waveforms, a voltage higher than a rated voltage is applied to the insulating layer.

Therefore, it is particularly important not to expose the insulating layer to which the alternating-current voltage is applied to an environment in which partial discharge occurs. In order to suppress partial discharge, it is conceivable to employ a method of manufacturing that completely fills the space with an insulator so that no air layer is present between electrodes and is configured to maintain the state even in a usage environment with varied temperatures or to employ a method in which the insulating layer has a thickness that does not cause partial discharge even if an air layer is generated by exfoliation or the like. The power module of the present embodiment employs the latter approach.

Figure 5:
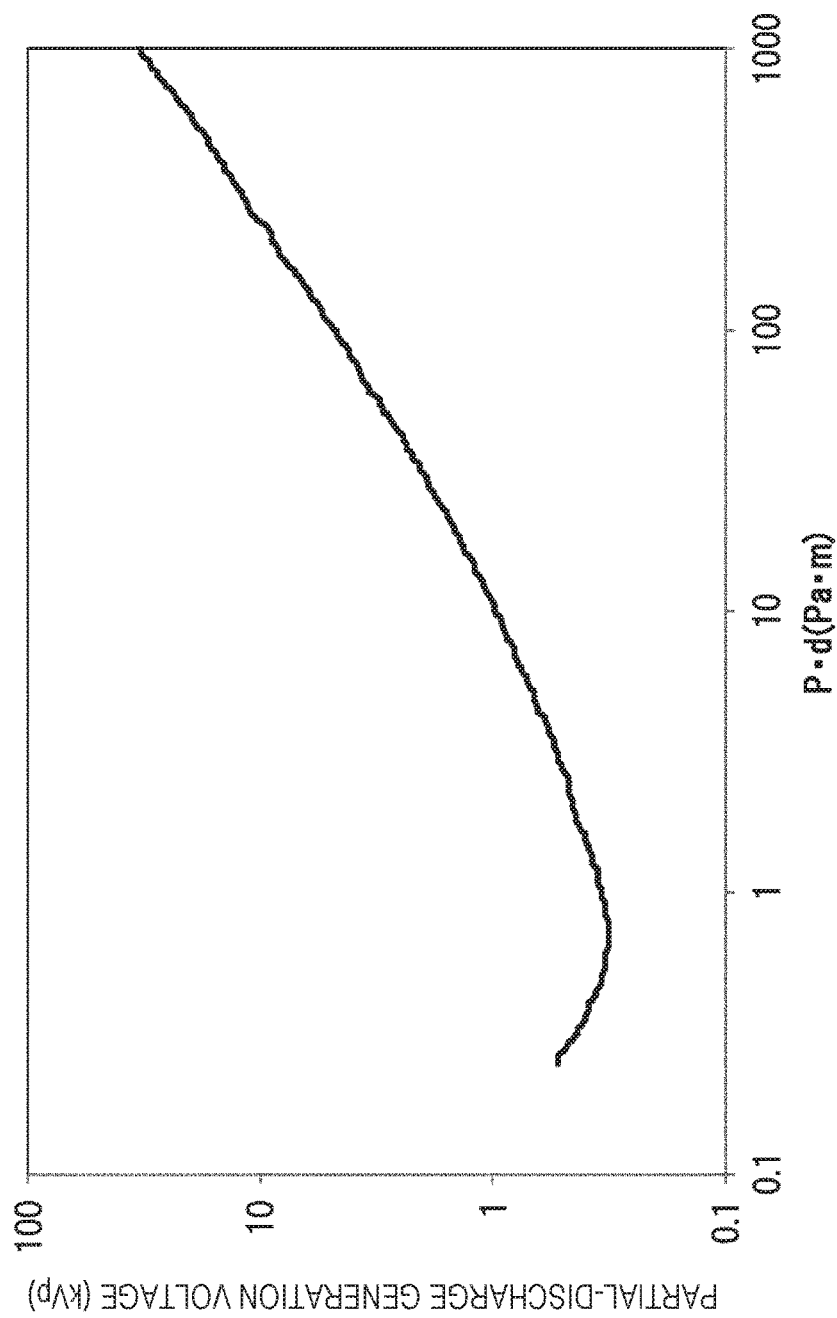
FIG. 5 shows a relation between partial-discharge generation voltages and atmospheric pressures p∩inter-electrode distance d according to Paschen's Law.

The voltage at which partial discharge occurs will be described by using FIG. 5. Paschen has shown the fact that, if a gap is present between electrodes, the voltage at which partial discharge starts is represented by a function of an atmospheric pressure and the gap length between electrodes, and, thereafter, it has been theoretically and experimentally confirmed by many researchers. FIG. 5 is a graph showing the voltage at which partial discharge occurs when the voltage is applied to electrodes having an inter-electrode distance d at an atmospheric pressure p is shown by the relation of the product of the atmospheric pressure p and the inter-electrode distance d. FIG. 5 is measured at 20° C. The partial-discharge generation voltage has a minimum value when the product p·d of the atmospheric pressure and the inter-electrode distance is a certain value as shown in FIG. 5. More specifically, when the voltage exceeding the voltage which is the minimum value of the partial-discharge generation voltage is applied to the gap between the electrodes, partial discharge is generated depending on the value of the p·d product.

Since the pressure according to the Paschen's Law can be converted to the particle density of a gas, partial-discharge starting voltages at arbitrary temperatures and pressures can be obtained by using a gas state equation. When the partial-discharge starting voltage obtained in this manner is substituted into $V_1$ in Expression (1), the minimum value of the inter-electrode voltage V at which discharge occurs can be calculated according to the relation with the atmospheric pressure p and the thickness $d_e$ of the air layer. Graphs in which the values of the minimum partial-discharge voltages calculated in such a manner are plotted with respect to the thickness $d_f$ of the insulating layer are shown from FIG. 6 to FIG. 8.

Figure 6:
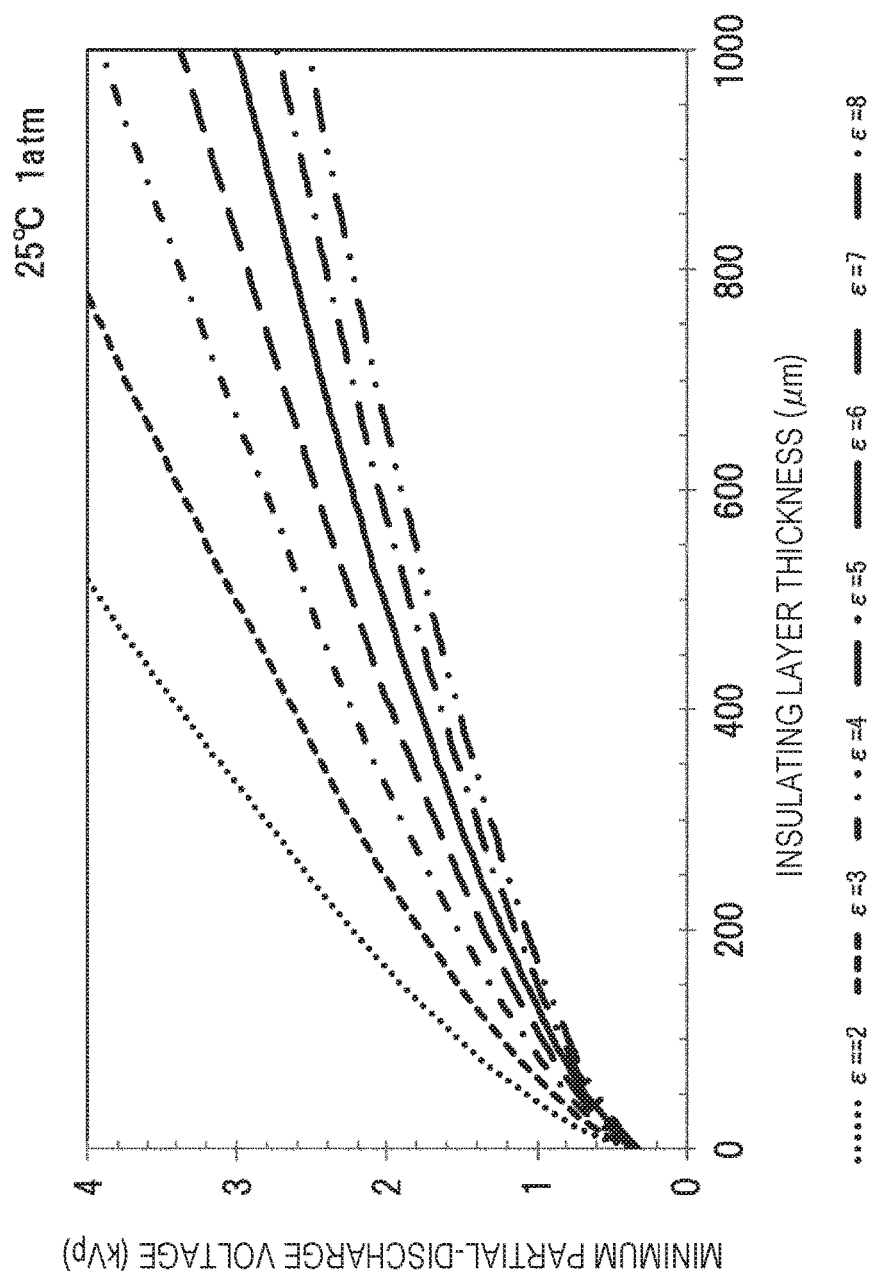
FIG. 6 shows the relation between minimum partial-discharge voltages and insulating layer thicknesses.

FIG. 6 shows the relation between minimum partial-discharge voltages and insulating layer thicknesses $d_f$ at 25° C. and 1 atm. If the insulating layer thickness $d_f$ becomes thick, the voltage shared by the insulating layer 851 becomes high with respect to the voltage V, and, therefore, the voltage $V_1$ shared by the air layer 850 becomes small. Therefore, the larger the insulating layer thickness $d_f$, the higher the minimum partial-discharge starting voltage.

Herein, a notable point is the point that the relation of the minimum partial-discharge voltage with respect to the insulating layer thickness $d_f$ is not proportional. More specifically, the slope of the graph in the region in which the insulating layer thickness $d_f$ is small is steeper compared with the slope of the graph in the region in which the insulating layer thickness $d_f$ is large. By utilizing this characteristic, reduction of the insulating layer thickness can be realized while ensuring insulating performance as described later. It can be also understood from FIG. 6 that, at the same minimum partial-discharge voltage, the lower the permittivity of the insulating layer 851, the more the thickness $d_f$ thereof can be reduced.

Figure 7:
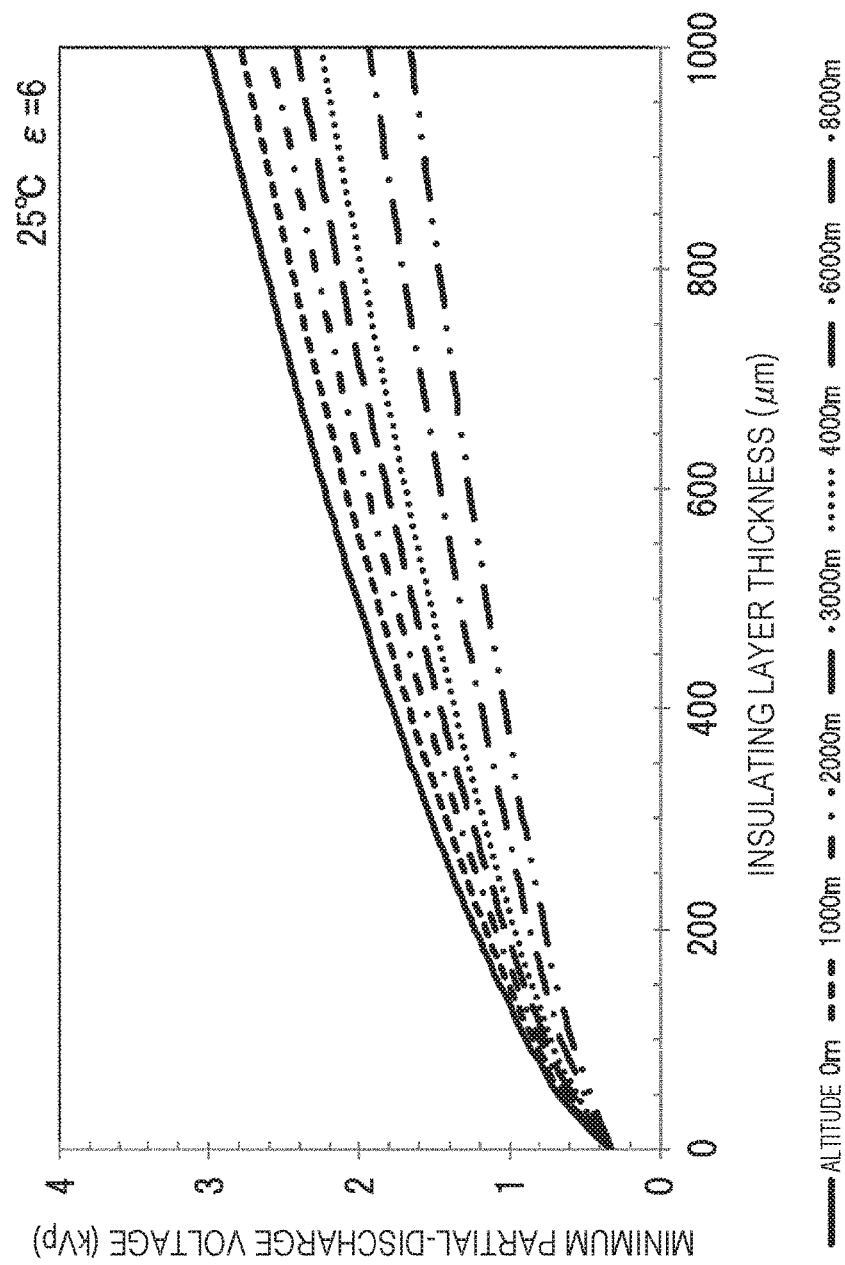
FIG. 7 shows the relation between minimum partial-discharge voltages and insulating layer thicknesses in consideration of atmospheric pressure changes due to altitude.

FIG. 7 shows the relation between the minimum partial-discharge voltage and the insulating layer thickness $d_f$ at 25° C. with a relative permittivity 6 of the insulating layer. It can be understood from FIG. 7 that, in order to obtain the same minimum partial-discharge voltage, the higher the altitude, in other words, the higher the atmospheric pressure, the more the insulating layer thickness has to be thickened. This influence became notable particularly around over 4000 m.

Figure 8:
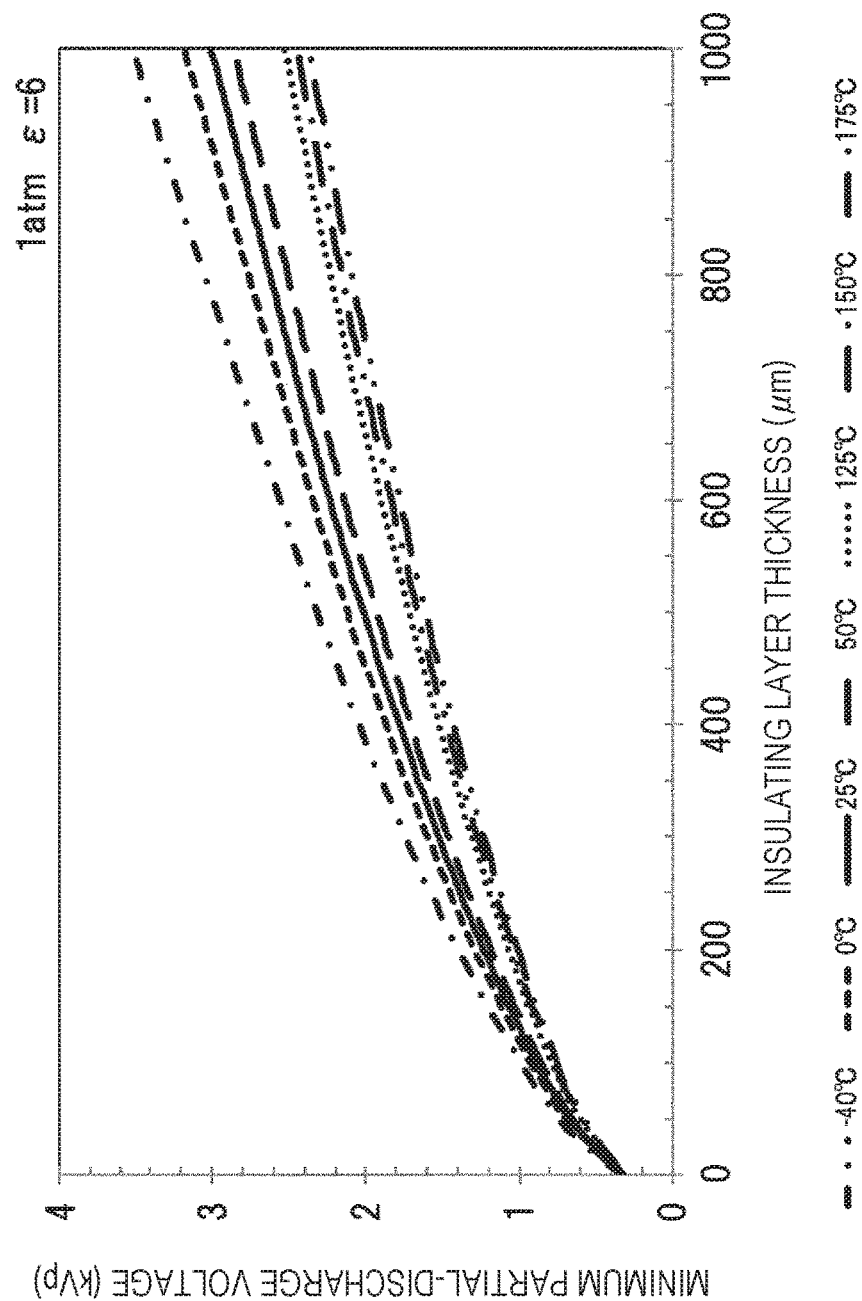
FIG. 8 shows the relation between minimum partial-discharge voltages and insulating layer thicknesses in consideration of particle density changes due to temperatures.

FIG. 8 shows the relation between the minimum partial-discharge voltage and the insulating layer thickness $d_f$ at 1 atm with a relative permittivity 6 of the insulating layer. It can be understood from FIG. 8 that, in order to obtain the same minimum partial-discharge voltage, the higher the temperature, the more the insulating layer thickness $d_f$ has to be increased. This influence became notable particularly around over 50° C.

Figure 9:
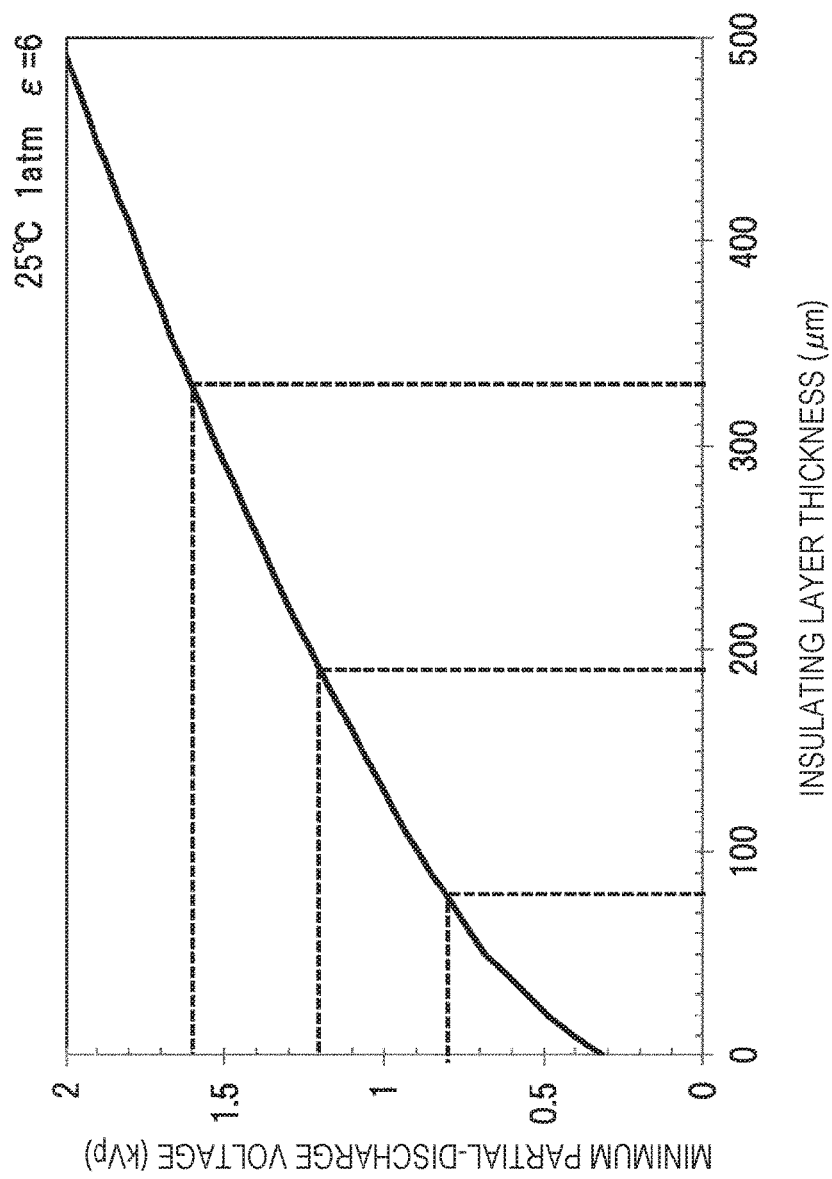
FIG. 9 shows the relation between minimum partial-discharge voltages and insulating layer thicknesses.

FIG. 9 shows the relation between the minimum partial-discharge voltage and the insulating layer thickness $d_f$ at 25° C. and 1 atm with a relative permittivity 6. Principles of reducing the total thickness $d_f$ of the insulating layer 851 while suppressing partial discharge will be described by using FIG. 9.

For example, a case in which at most a voltage of 1.6 kVp is applied between electrodes is considered. According to FIG. 9, the minimum partial-discharge voltage in a case in which the insulating layer thickness $d_f$ is 330 μm is 1.6 kVp. Therefore, even when a gap is generated due to exfoliation or the like, as long as the insulating layer is formed to be thicker than 330 μm, partial discharge does not occur.

On the other hand, in the case in which the voltage applied between the electrodes is 0.8 kVp, if the insulating layer is thicker than 80 μm, partial discharge does not occur. This is for a reason that, as described above, the relation between the minimum partial-discharge voltage and the insulating layer thickness $d_f$ is not a proportional relation, but has a steep slope in the region in which the insulating layer thickness $d_f$ is small, and the slope becomes less steep as the insulating layer thickness $d_f$ is increased.

Therefore, even with a voltage of 1.6 kVp, when the voltage is divided by 2 into 0.8 kVp and 0.8 kVp to provide insulating layers each thicker than 80 μm, discharge can be suppressed. By virtue of this, the total thickness of the insulating layer required for a single layer to be 330 μm can be reduced to 160 μm. Herein, the example of 2 layers has been shown. However, it is obvious that the thickness can be further reduced by using 3 layers or more. If the thickness of the insulating layer can be reduced, thermal resistance is reduced by the amount corresponding to that, and, therefore, heat dissipation performance is improved. Furthermore, there is an effect that material cost can be reduced by the amount of reduction of the insulating layer. Therefore, subsequently, a model about the structure for dividing the voltage applied to the insulating layer of the power module will be described by using FIG. 10 to FIG. 13.

Figure 10:
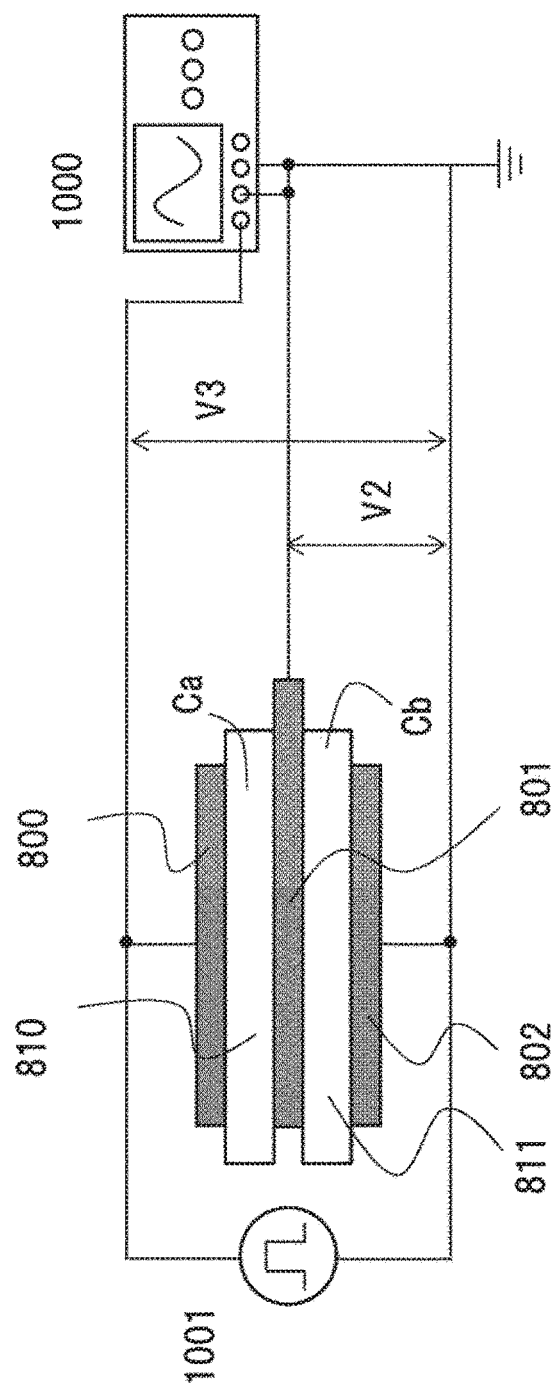
FIG. 10 is a schematic diagram of an experimental system including an insulating layer part to which an alternating-current voltage of the power module is applied.

FIG. 10 is a schematic diagram of an experimental system in which an alternating-current voltage is applied to an insulating layer part having an intermediate conductor. As described above, in the power module of FIG. 3, a direct current flows to the conductor plate 319, but an alternating current flows to the conductor plate 320. FIG. 10 shows a voltage share model of the insulating layer of the power module to which the alternating-current voltage is applied. An electrode 800 of FIG. 10 corresponds to the conductor plate 320 of FIG. 3, an intermediate conductor 801 of FIG. 10 corresponds to the intermediate conductor 910 of FIG. 3, an electrode 802 of FIG. 10 corresponds to a heat dissipating surface 307 of FIG. 3, and insulating layers 810 and 811 of FIG. 10 correspond to the insulating layer 900 of FIG. 3.

The electrodes 800 and 801 are connected to a transmitter 1001. The intermediate conductor 801 is disposed between the electrode 800 and the electrode 801. The insulating layer 810 is disposed between the electrode 800 and the intermediate conductor 801. The insulating layer 811 is disposed between the electrode 802 and the intermediate conductor 801. The electrode 802 is grounded to GND. The voltage between the intermediate conductor 801 and the electrode 802 is assumed to be $V_2$, and the voltage between the electrode 800 and the electrode 802 is assumed to be $V_3$. In this case, the voltage sharing of the capacity circuit when the alternating-current voltage is applied can be calculated by below expressions.

$$V_2 = V_3 \cdot C_a / (C_a + C_b) \quad \text{(Mathematical Expression 4)}$$

$$C_a = \varepsilon_0 \cdot \varepsilon_a \cdot S_a / d_a \quad \text{(Mathematical Expression 5)}$$

$$C_b = \varepsilon_0 \cdot \varepsilon_b \cdot S_b / d_b \quad \text{(Mathematical Expression 6)}$$

However, $C_a$ represents the capacity between the electrode 800 and the intermediate conductor 801, $C_b$ represents the capacity between the intermediate conductor 801 and the electrode 802, $\varepsilon_0$ represents permittivity of vacuum, $\varepsilon_a$ represents relative permittivity of the insulating layer 810, $\varepsilon_b$ represents relative permittivity of the insulating layer 811, $S_a$ represents the area by which projected surfaces of the electrode 800 and the intermediate conductor 801 are overlapped in the disposed direction thereof, $S_b$ represents the area by which projected surfaces of the intermediate conductor 801 and the electrode 802 are overlapped in the disposed direction thereof, $d_a$ represents the thickness of the insulating layer 810, and $d_b$ represents the thickness of the insulating layer 811.

Herein, when $\varepsilon_a = \varepsilon_b$, $d_a = d_b$, $S_a = S_b$ are obtained by adjusting the structure of the voltage share model and the material of the insulating layers, $C_a = C_b$ is obtained. In this case, according to Expression (4), the voltage share rate obtained by dividing $V_2$ by $V_3$ becomes 50%. The present model is configured to provide $C_a = C_b$.

$$V_2/V_3 = 50\% \quad \text{(Mathematical Expression 7)}$$

Figure 11:
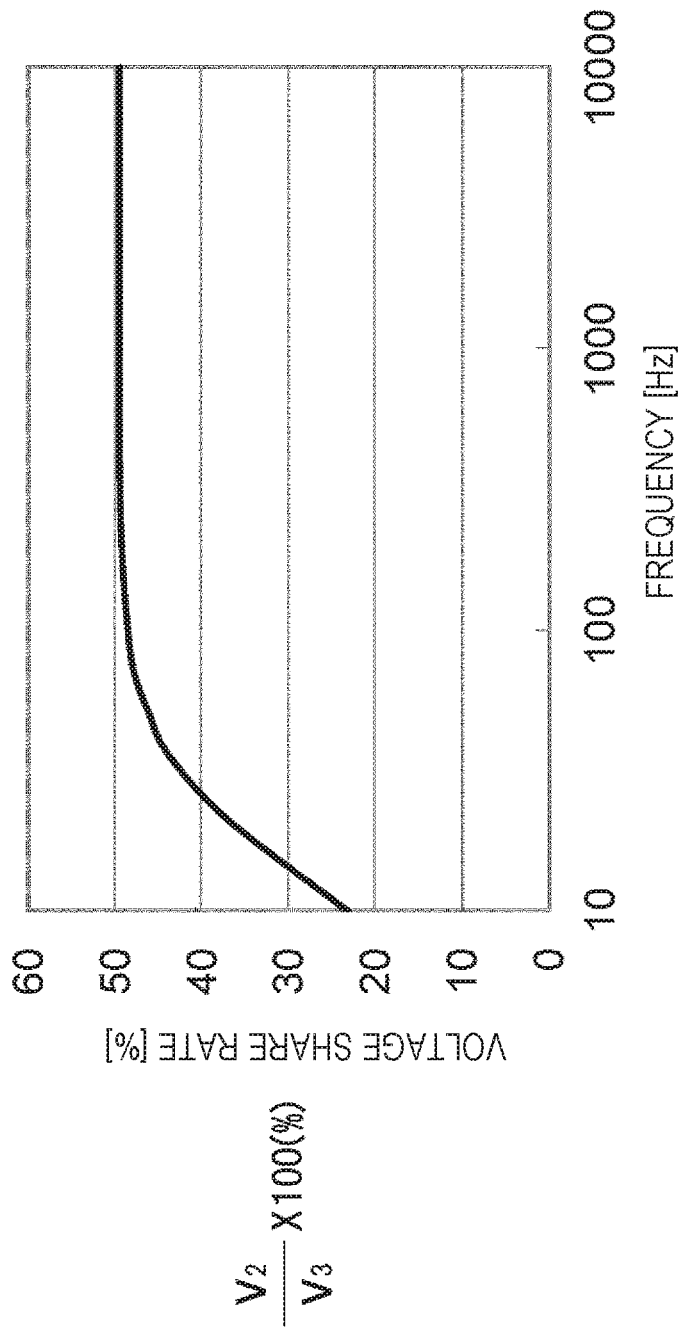
FIG. 11 shows the relation between voltage share rates and frequencies.

FIG. 11 is a graph showing the voltage share rate $V_2/V_3$ in the case in which the frequency of the transmitter 1001 of FIG. 10 is varied. The voltage share rate was obtained by measuring the voltage $V_1$ between the intermediate conductor 801 and the electrode 802 and the voltage $V_2$ between the electrode 800 and the electrode 802 by measuring by a curve tracer 1000.

According to FIG. 11, there is an inclination that the voltage share rate gets closer to 50% as the frequency of the voltage applied between the electrode 800 and the electrode 802 is increased. When the frequency exceeds 100 Hz, the voltage share rate becomes almost 50%. Such an inclination was similar also for sine waves and rectangular waves.

According to the results of the present model, it can be understood that the voltage applied to the insulating layer depending on the capacity can be shared by providing the intermediate conductor in the insulating layers between the electrodes to which the alternating-current voltage of 100 Hz or more is applied.

Note that, a current was output from the intermediate conductor 801 for model evaluation in this case. However, in an actual power module, there is no need to extract a current from the intermediate conductor. Therefore, the intermediate conductor can be buried in the insulating layers. When the intermediate conductor is buried in the insulating layers, end faces of the intermediate conductor can be prevented from approaching the electrodes, and discharge from the end faces can be prevented.

In the case in which the intermediate conductor is to be buried in the insulating layers, when insulating layers having the same materials are used as upper/lower layers of the intermediate conductor and the external dimensions of the intermediate conductor are aligned with the size of any of the electrodes opposed thereto, even if it has different sizes from the other electrode, the capacities in both sides of the intermediate conductor can be caused to be equivalent to each other. In this case, it is practically difficult to completely equally align them. Therefore, in consideration of position adjustment and dimensional tolerance, it is desired that the intermediate conductor be slightly larger than the electrode of the side having a smaller area. This is for a reason that, if the intermediate conductor is smaller, the part that is not subjected to sharing of the voltage is generated, and partial discharge occurs in some cases due to exfoliation. The power module of the present embodiment has the intermediate conductors 910 and 911 having slightly larger areas than the areas of the conductor plates 320 and 315.

Note that the intermediate conductor 910 of the direct current side is not restricted by the size of the conductor plate 315 for later-described reasons and may be larger or smaller than the conductor plate. Alternatively, it can be omitted.

The power module of the present embodiment having the 2-in-1 module structure, which is the upper/lower arm circuits made into modules, has the conductor plate which transmits direct currents and the conductor plate which transmits alternating currents. Therefore, in the insulating layer disposed between the electrically-conductive heat dissipating surface and the conductor plate, a part to which the direct-current voltages are applied and the part to which the alternating-current voltages are applied are present. In the power module of FIG. 3, alternating-current voltages are applied between the conductor plate 320 and the heat dissipating surface 307, and direct-current voltages are applied between the conductor plate 315 and the heat dissipating surface 307.

The power module of the present embodiment provides the intermediate conductor 910 in the insulating layer of the side to which the alternating-current voltage is applied, and the power module provides the intermediate conductor 911 in the insulating layer of the side to which the direct-current voltage is applied. The intermediate conductor 910 and the intermediate conductor 911 are disposed to be electrically independent from each other. Herein, the intermediate conductor 910 is disposed between the conductor plate 320 and the heat dissipating surface 307 to which the alternating-current voltage is applied, and, as a result, voltage sharing corresponding to the capacity formed between the conductors occurs. As a result, according to the principles shown in FIG. 9, the thickness of the insulating layer which obtains a predetermined withstand voltage can be reduced.

On the other hand, even if the intermediate conductor is disposed between the conductor plate 315 and the heat dissipating surface 307 to which the direct-current voltage is applied, voltage sharing does not occur. This is for a reason that the frequency of the direct-current voltage is 0.

Subsequently, as a comparative example, voltage sharing of a case in which the intermediate conductor 910 and the intermediate conductor 911 are electrically connected will be described by using FIG. 12 and FIG. 13.

Figure 12:
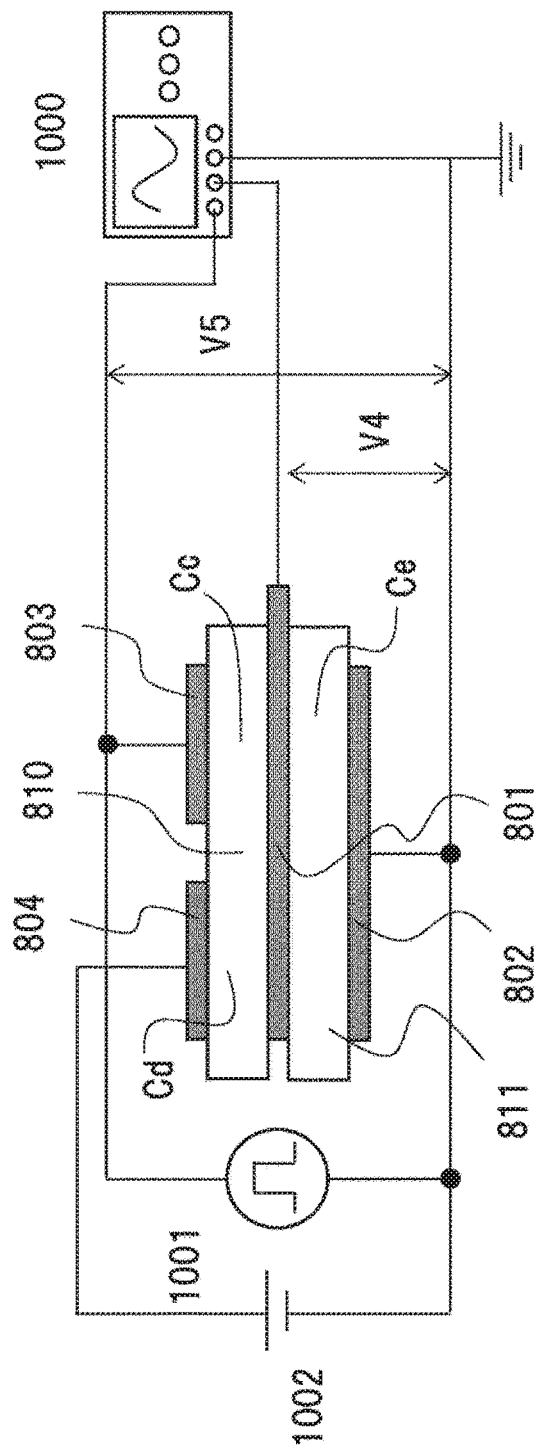
FIG. 12 is a schematic diagram of an experimental system including an insulating layer part of a power module.

FIG. 12 is a schematic diagram of an experimental system in which a direct-current voltage and an alternating-current voltage are applied to an insulating layer part having a direct-current conductor. An electrode 802 of FIG. 12 corresponds to the heat dissipating surface 307 of FIG. 3, an electrode 803 of FIG. 12 corresponds to the conductor plate 320 of FIG. 3, an electrode 804 of FIG. 12 corresponds to the conductor plate 315 of FIG. 3, and the insulating layers 810 and 811 of FIG. 12 correspond to the insulating layer 900 of FIG. 3. The intermediate conductor 801 of FIG. 12 corresponds to the intermediate conductors 910 and 911 of FIG. 3 which are electrically connected to each other.

The electrode 803 and the electrode 802 are connected to a transmitter 1001. The electrode 804 and the electrode 802 are connected to a direct-current power source 1002. The intermediate conductor 801 is opposed to the electrode 803 with the insulating layer 810 interposed therebetween and is disposed so as to be opposed to the electrode 804 with the insulating layer 810 similarly interposed therebetween. Moreover, the intermediate conductor 801 is disposed to be opposed to the electrode 802 with the insulating layer 811 interposed therebetween. The electrode 802 is grounded to GND. The voltage between the intermediate conductor 801 and the electrode 802 is assumed to be $V_4$, and the voltage between the electrode 803 and the electrode 802 is assumed to be $V_5$. The capacity between the electrode 804 and the intermediate conductor 801 is added in parallel to the capacity between the intermediate conductor 801 and the electrode 802 via the power source circuit 1002. Therefore, the voltage sharing of the capacity circuit in a case in which an alternating-current voltage is applied is expressed by following expressions.

$$V_4 = V_5 \cdot C_c/(C_c + C_d + C_e) \qquad \text{(Mathematical Expression 8)}$$

$$C_c = \varepsilon_0 \cdot \varepsilon_c \cdot S_c/d_c \qquad \text{(Mathematical Expression 9)}$$

$$C_d = \varepsilon_0 \cdot \varepsilon_d \cdot S_d/d_d \qquad \text{(Mathematical Expression 10)}$$

$$C_e = \varepsilon_0 \cdot \varepsilon_e \cdot S_e/d_e \qquad \text{(Mathematical Expression 11)}$$

However, $C_c$ represents the capacity between the alternating-current-side electrode 803 and the intermediate conductor 801, $C_d$ represents the capacity between the direct-current-side electrode 804 and the intermediate conductor 801, $C_e$ represents the capacity between the intermediate conductor 801 and the electrode 802, $\varepsilon_0$ represents permittivity of vacuum, $\varepsilon_c$ represents relative permittivity of the insulating layer between the alternating-current-side electrode 803 and the intermediate conductor 801, $\varepsilon_d$ represents relative permittivity of the insulating layer between the direct-current-side electrode 804 and the intermediate conductor 801, $\varepsilon_e$ represents relative permittivity of the insulating layer between the intermediate conductor 801 and the electrode 802, $S_c$ represents the area by which projected surfaces of the alternating-current-side electrode 803 and the intermediate conductor 801 are overlapped in the disposed direction thereof, $S_d$ represents the area by which projected surfaces of the direct-current-side electrode 804 and the intermediate conductor 801 are overlapped in the disposed direction thereof, $S_e$ represents the area by which projected surfaces of the intermediate conductor 801 and the electrode 802 are overlapped in the disposed direction thereof, $d_c$ represents the thickness of the insulating layer between the alternating-current-side electrode 803 and the intermediate conductor 801, $d_d$ represents the thickness of the insulating layer between the direct-current-side electrode 804 and the intermediate conductor 801, $d_e$ represents the thickness of the insulating layer between the intermediate conductor 801 and the electrode 802.

Herein, it is prepared so that the capacity becomes $2.1 C_c = 2.1 C_d = C_e$, and the voltage share rate (%) obtained by dividing $V_4$ by $V_5$ is calculated. As a result, the following is obtained.

$$V_4/V_5 \approx 24.4\% \qquad \text{(Mathematical Expression 12)}$$

Figure 13:
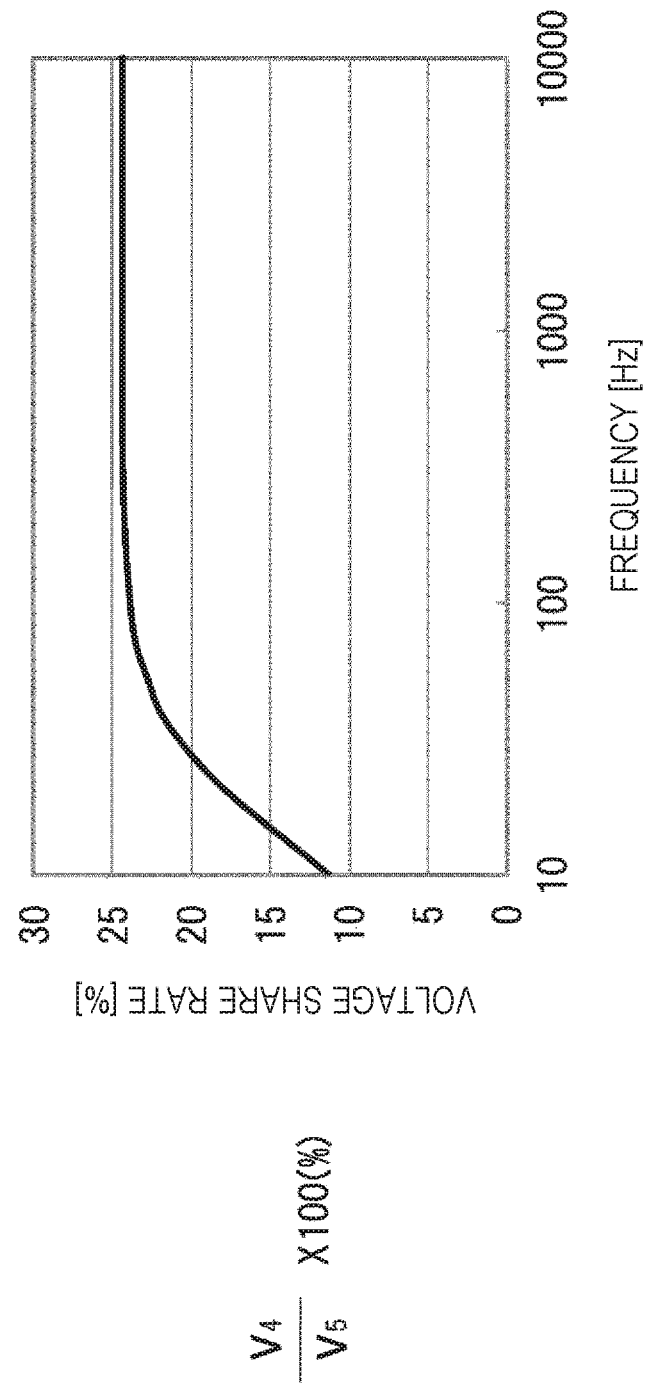
FIG. 13 shows the relation between voltage share rates and frequencies.

FIG. 13 is a graph showing the voltage share rate $V_4/V_5$ in the case in which the frequency of the transmitter 1001 of FIG. 12 is varied. The voltage share rate was obtained by measuring the voltage $V_4$ between the intermediate conductor 801 and the electrode 802 and the voltage $V_5$ between the electrode 803 and the electrode 802 by measuring by a curve tracer 1000.

According to FIG. 13, there is an inclination that the voltage share rate gets closer to 24.4% as the frequency of the voltage applied between the electrode 803 and the electrode 802 is increased. When the frequency exceeds 100 Hz, the voltage share rate becomes almost 24.4% which is equal to a calculated value. Such an inclination was similar also for sine waves and rectangular waves.

According to the results of this model, it can be understood that, in the case in which the intermediate conductors of the alternating-current side and the direct-current side are coupled to each other, when an alternating-current voltage is subjected to voltage sharing, a high voltage is applied between the electrode 803 and the intermediate conductor 801. This is for a reason that the capacity $C_d$ between the electrode 804 and the intermediate conductor 801 is added in parallel to the capacity $C_e$ between the intermediate conductor 801 and the electrode 802 via a power source path.

In this case, the insulating layer thickness has to be increased between the electrode 803 and the intermediate conductor 801 having the high voltage share rate so as not to cause partial discharge. According to FIG. 9, it can be understood that, if a voltage of 1.2 kVp, which is the 75% voltage of 1.6 kVp, is to be applied, the insulating layer has to be thicker than 190 μm. As described above, if the voltage of 1.6 kVp is equally shared by 0.8 kVp and 0.8 kVp, since the insulating layer thickness required to suppress discharge is 160 μm, this thickness is exceeded only by one voltage sharing side.

Meanwhile, in the case in which the alternating-current voltage applied to the insulating layer is to be equally shared, the relative permittivity of the insulating layers and the upper/lower-layer insulating layer thicknesses of the intermediate conductor have to be adjusted to satisfy the following expression.

$$C_c/(C_c+C_d+C_e) \approx 0.5 \quad \text{(Mathematical Expression 13)}$$

In other words, the following expression has to be satisfied.

$$C_c \approx C_d+C_e \quad \text{(Mathematical Expression 14)}$$

If $S_d$ or $S_e$ is to be reduced, there is an adverse effect that heat dissipation performance is reduced. If it is supported by the relative permittivity, the supportable range is limited since the relative permittivity is caused by materials and is difficult to be significantly changed. Therefore, it is desired to support it by the insulating layer thickness. However, in order to increase the thickness of the insulating layer constituting $C_c$ to more than 80 μm with which partial discharge does not occur at a voltage of 0.8 kVp and to satisfy the above described Expression, the total thickness of the insulating layer cannot be smaller than 160 μm.

Moreover, in the path from the power module to the power source, a smoothing capacitor and parasitic capacities of a bus bar and a chassis are present. Since these capacities are also superimposed, it becomes difficult to design the insulating layer singularly by the power module.

Therefore, in the power module of the 2-in-1 structure, thickness reduction of the insulating layer can be achieved by disposing the intermediate conductors so that the intermediate conductor is electrically separated to the direct current side and the alternating current side.

Moreover, even if the intermediate conductor of the side to which the direct-current voltage is applied is omitted, the voltage applied to the insulating layer is not changed. Therefore, it is also effective to omit the intermediate conductor of the direct current side. However, if the intermediate conductor is provided also in the direct current side, heat can be diffused since the layer of the intermediate conductor having a high thermal conductivity with respect to the insulating layer is provided, and heat dissipation performance can be improved.

Meanwhile, if the insulating layer is an adhesive material such as an insulating sheet, the intermediate conductors having the same thickness are provided in the direct current side and the alternating current side. As a result, the load in pressure bonding can be equalized, and even pressure-bonded surfaces can be formed.

Figure 14:
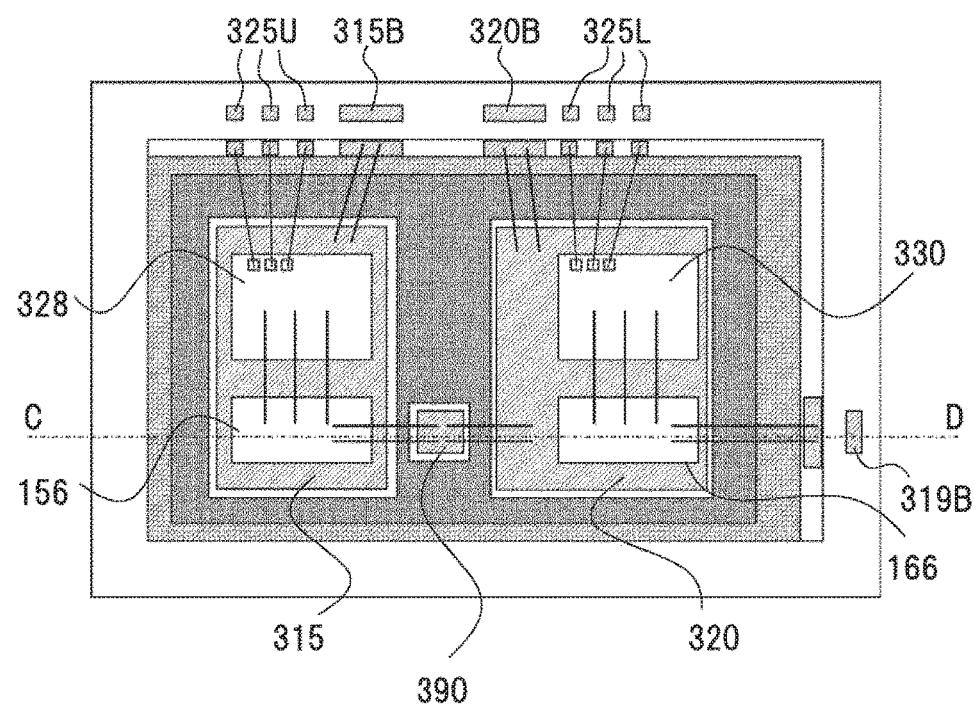
FIG. 14 is a plan view of a power module of a second embodiment.
Figure 15:
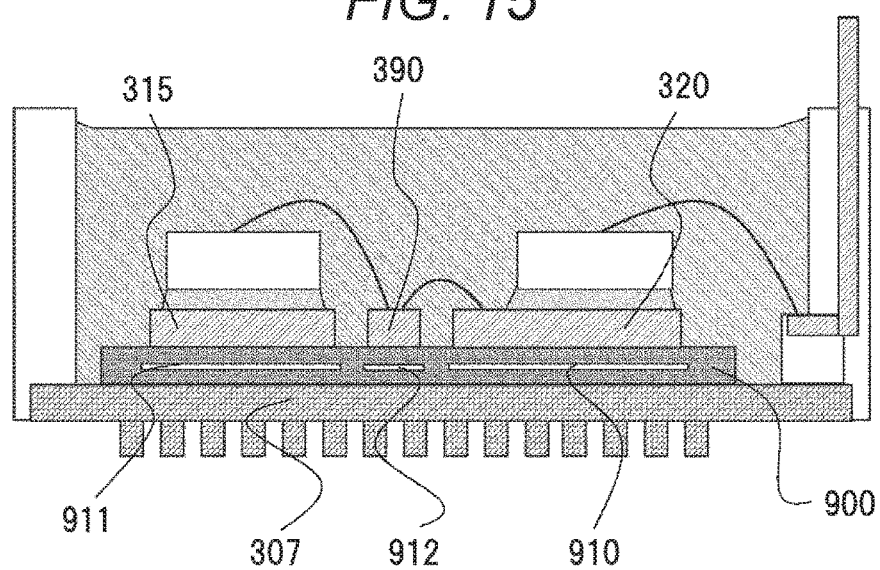
FIG. 15 is a cross-sectional view of the power module of FIG. 14 sectioned by a cross section C-D.

A power module according to a second embodiment will be described by using FIG. 14 and FIG. 15. The power module of the second embodiment is a modification example of the power module of the first embodiment. FIG. 14 is a plan view, and FIG. 15 is a cross-sectional view sectioned by a cross section C-D of FIG. 14.

In the present embodiment, emitter-side electrodes of a power semiconductor element are connected by wires. A conductor plate 320 connected to a collector side of a lower-arm-side IGBT 330 and an emitter surface of an upper-arm-side IGBT 328 are connected via an intermediate electrode 390. As well as the conductor plates 320 and 315, the intermediate electrode 390 is disposed so as to be opposed to a heat dissipating surface 307 via an insulating layer 900. An intermediate conductor 912 is disposed between the intermediate electrode 390 and the heat dissipating surface 307. As well as the intermediate conductors 910 and 911, the intermediate conductor 912 is buried in the insulating layer 900.

Since an alternating-current voltage is applied to the intermediate electrode 390 as well as the conductor plate 320, voltage sharing can be carried out by the intermediate conductor 912.

A power module according to a third embodiment will be described by using FIG. 16 to FIG. 20.

Figure 16A:
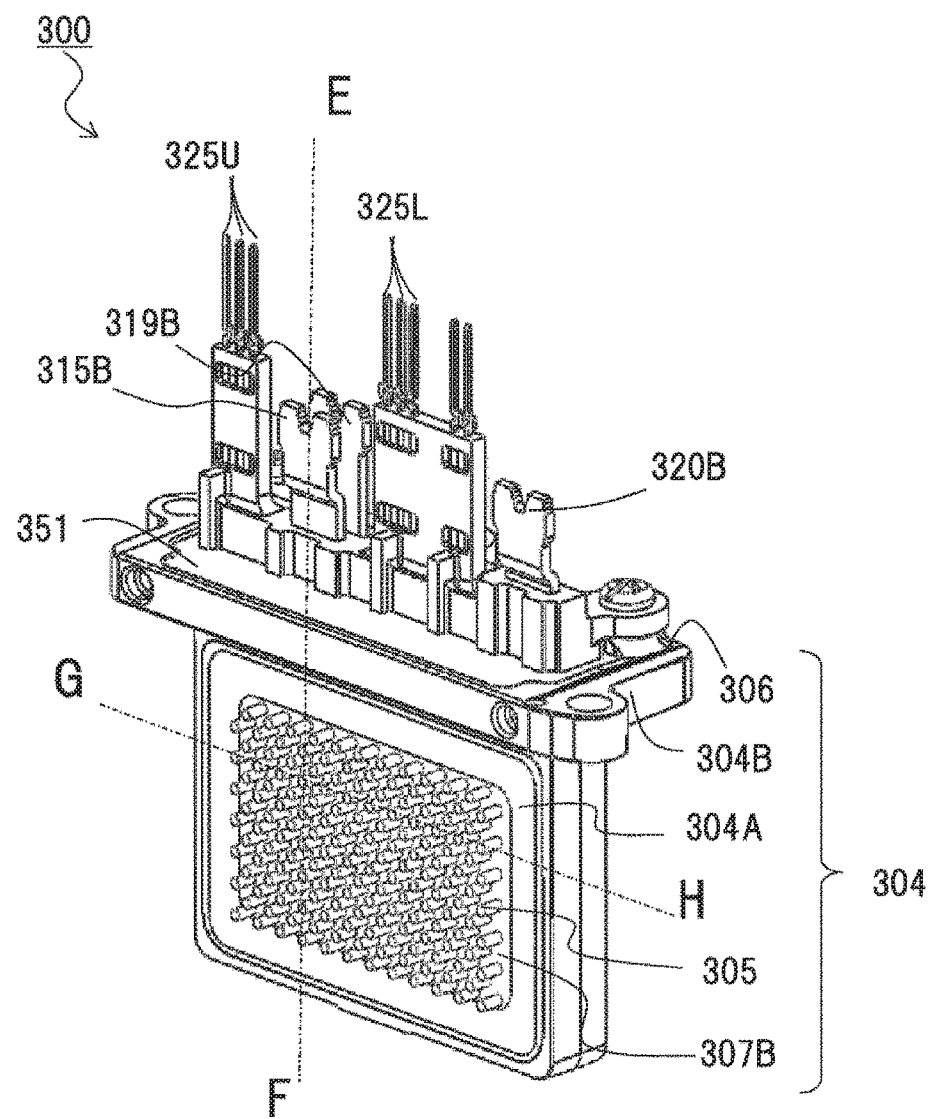
FIG. 16A is a perspective view of a power module of a third embodiment.
Figure 16B:
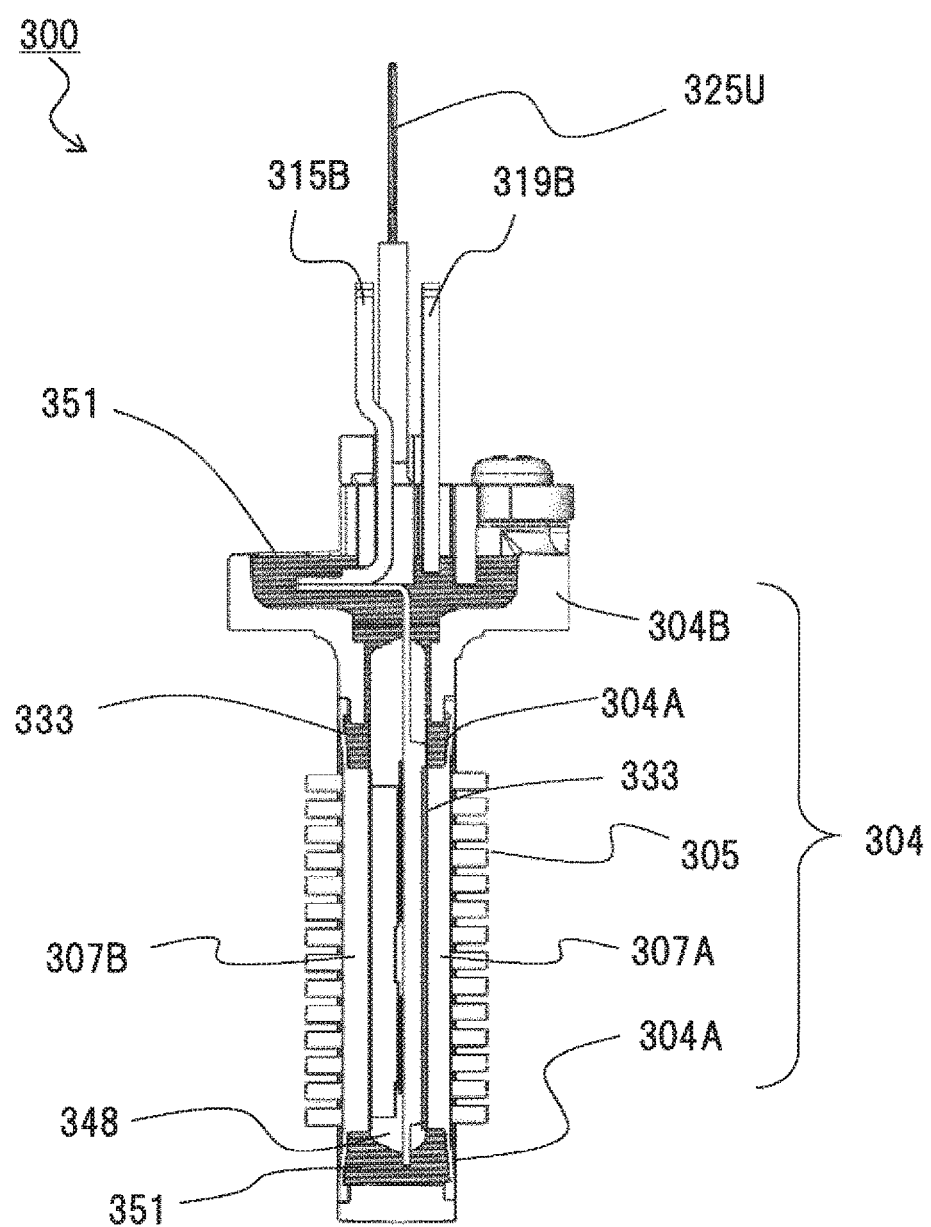
FIG. 16B is a cross-sectional view of the power module of FIG. 16A sectioned by a cross section E-F.

FIG. 16 (a) is a perspective view of the power module of the present embodiment, and FIG. 16 (b) is a cross-sectional view of a section by a cross section E-F of FIG. 16 (a). The power module 300 of the present embodiment has a both-side cooling structure in which a power semiconductor element is housed in a cooling body 304, which is a CAN-type cooler. The cooling body 304 has a first heat dissipating surface 307A and a second heat dissipating surface 307B on which heat dissipating fins 305 are formed, thin portions 304A which connect heat dissipating surfaces and a frame body, and a flange portion 304B. A circuit body including the power semiconductor element and conductor plates is inserted from an insertion opening 306 of a cooling body 304, which is formed in a bottomed tubular shape, and is sealed by a sealing material 351, thereby forming the power module 300. The power module of the present embodiment is excellent heat dissipation performance since the power semiconductor element is cooled from both sides, i.e., a first heat dissipating surface 307A and a second heat dissipating surface 307B.

Figure 17:
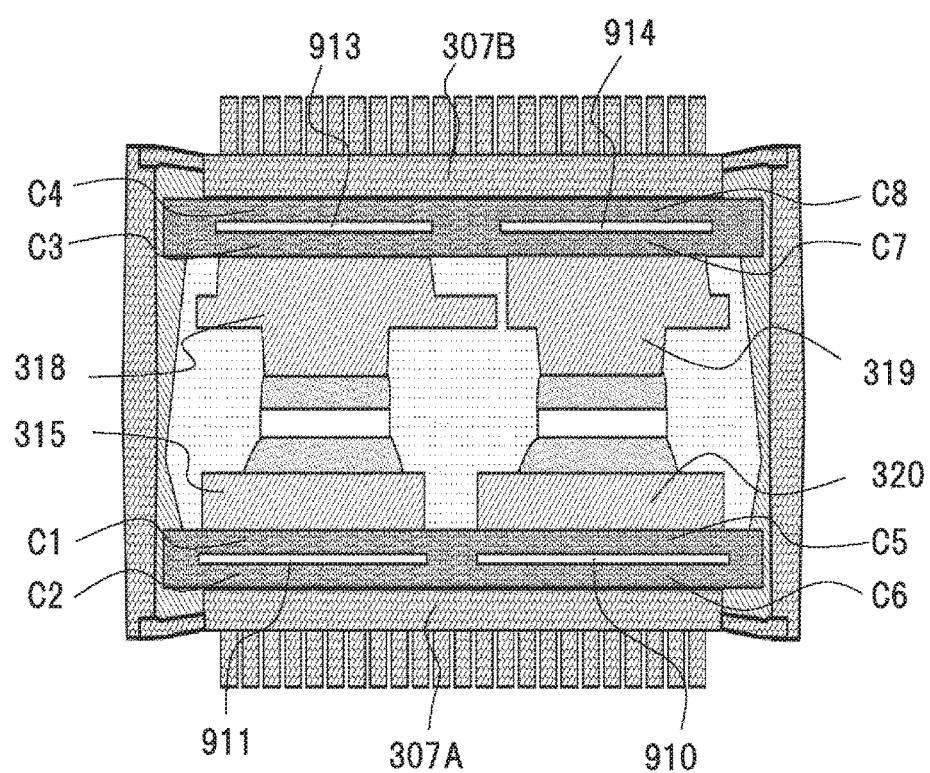
FIG. 17 is a schematic diagram of a cross section that is sectioned by a cross section G-H of FIG. 16A.

FIG. 17 is a schematic diagram of a cross section that is sectioned by a cross section G-H of FIG. 16 (a). The power module 300 of the present embodiment has intermediate conductors 910 and 911 in an insulating layer disposed in a first side of the power semiconductor element. In addition, the power module 300 has intermediate conductors 913 and 914 in an insulating layer disposed in a second side in the opposite side of the first side of the power semiconductor element. The intermediate conductor 910 is disposed between a conductor plate 320 and the heat dissipating surface 307A to which an alternating-current voltage is applied. The intermediate conductor 911 is disposed between a conductor plate 315 and the heat dissipating surface 307A to which a direct-current voltage is applied. The intermediate conductor 913 is disposed between a conductor plate 318 and the heat dissipating surface 307B to which an alternating-current voltage is applied. The intermediate conductor 914 is disposed between a conductor plate 319 and the heat dissipating surface 307B to which a direct-current voltage is applied.

The intermediate conductors form capacity circuits C1 to C8, respectively. The capacity C1 is a capacity between the conductor plate 315 and the intermediate conductor 911. The capacity C2 is a capacity between the intermediate conductor 911 and the heat dissipating surface 307A. The capacity C3 is a capacity between the conductor plate 318 and the intermediate conductor 913. The capacity C4 is a capacity between the intermediate conductor 913 and the heat dissipating surface 307B. The capacity C5 is a capacity between the conductor plate 320 and the intermediate conductor 910. The capacity C6 is a capacity between the intermediate conductor 910 and the heat dissipating surface 307A. The capacity C7 is a capacity between the conductor plate 319 and the intermediate conductor 914. The capacity C8 is a capacity between the intermediate conductor 914 and the heat dissipating surface 307B. However, the capacities C1 and C2 between the conductor plate 315 and the heat dissipating surface 307A and C8 and C9 between the conductor plate 319 and the heat dissipating surface 307B to which direct-current voltages are applied form capacity circuits only when the direct-current voltages are varied.

Figure 18:
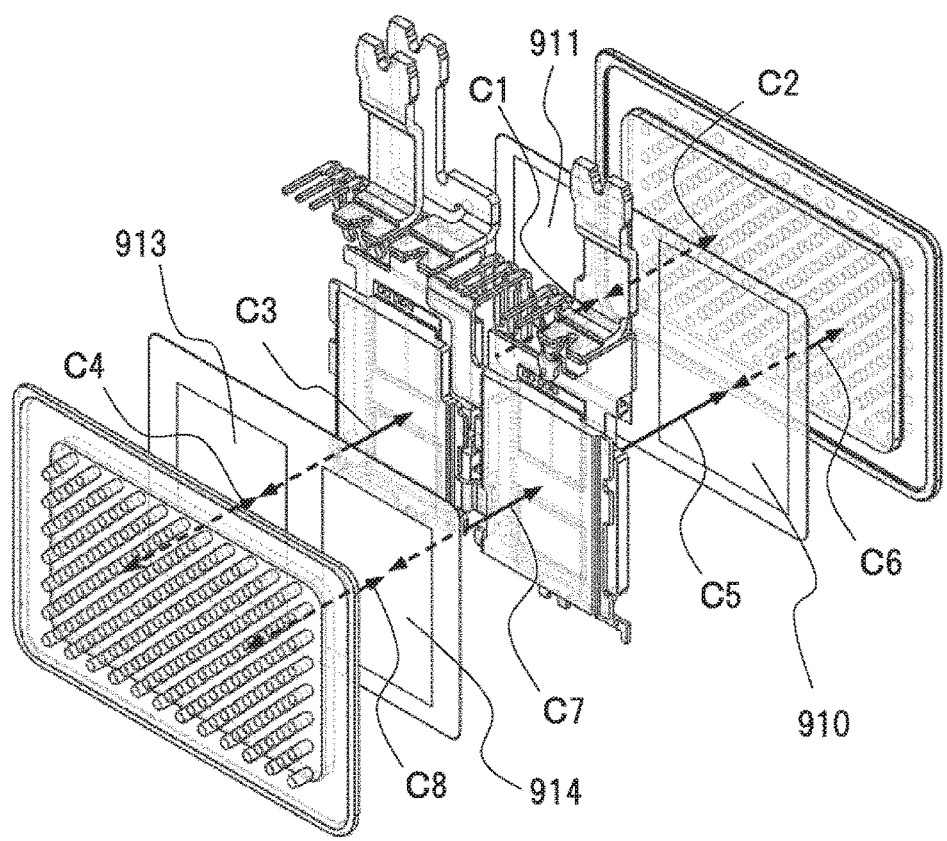
FIG. 18 is an exploded view showing the disposition of intermediate conductors in the power module of the third embodiment.

FIG. 18 is an exploded view for describing the disposition of the intermediate conductors in the power module of the present embodiment. For the sake of description, only part of the configuration is shown in the view.

Figure 19:
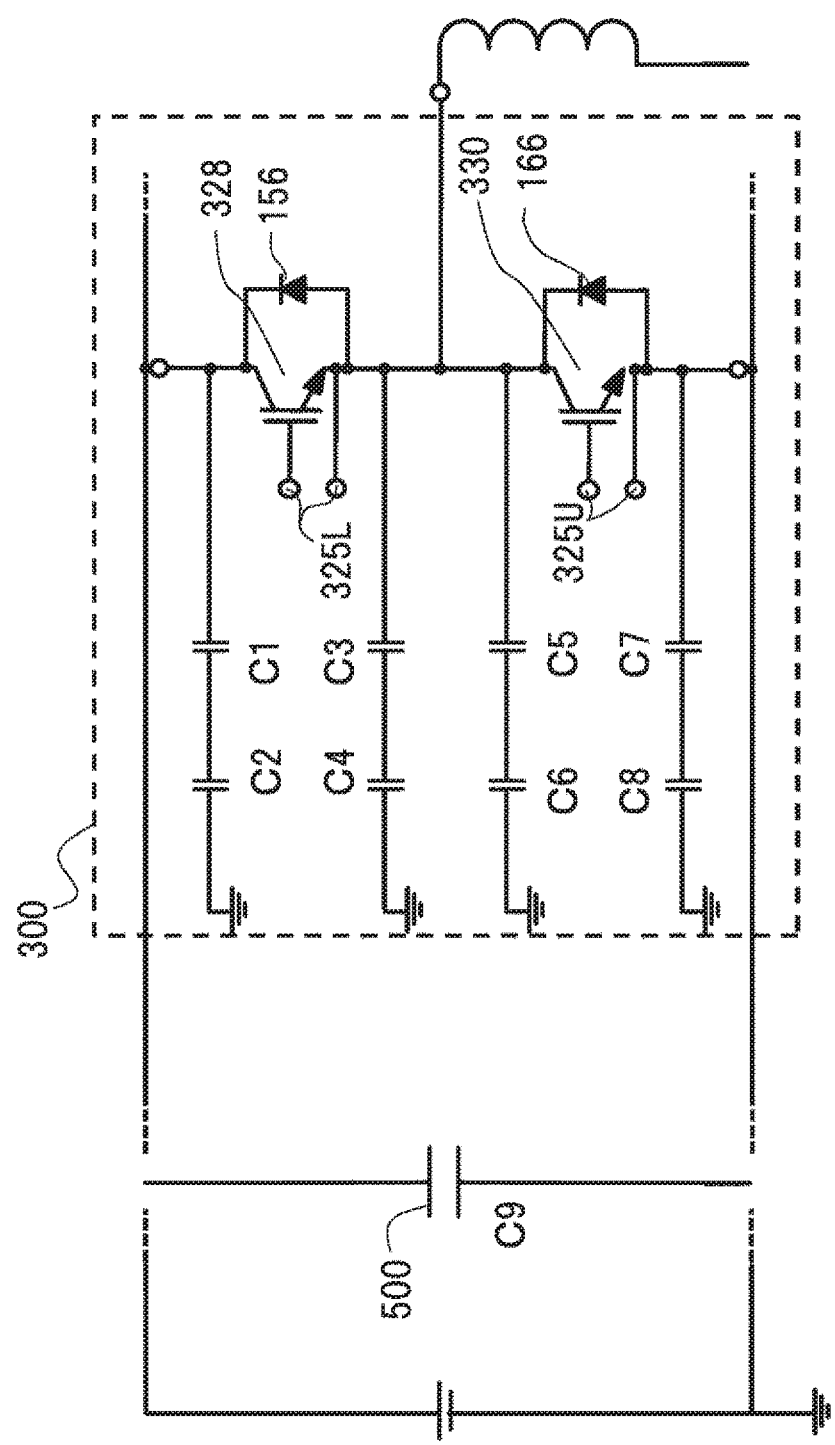
FIG. 19 is a circuit diagram of the power module and therearound.

FIG. 19 is a diagram showing the capacities C1 to C8 by a circuit diagram of the power module. The capacities C1, C2, C8, and C7 are the parts to which direct-current voltages are applied. Therefore, the intermediate conductors 911 and 914 of the parts can be omitted. The capacities C3, C4, C5, and C6 are the parts to which alternating-current voltages are applied. Therefore, the intermediate conductors 910 and 913 of the parts can share the voltages applied to the insulating layers.

The power module of the present embodiment is capable of reducing the thicknesses of the insulating layers by providing the intermediate conductor structures in the insulating layers in the power module having the both-side cooling structure excellent in cooling performance, and the power module which has better heat dissipation performance and has a high withstand voltage can be obtained.

Figure 20A:
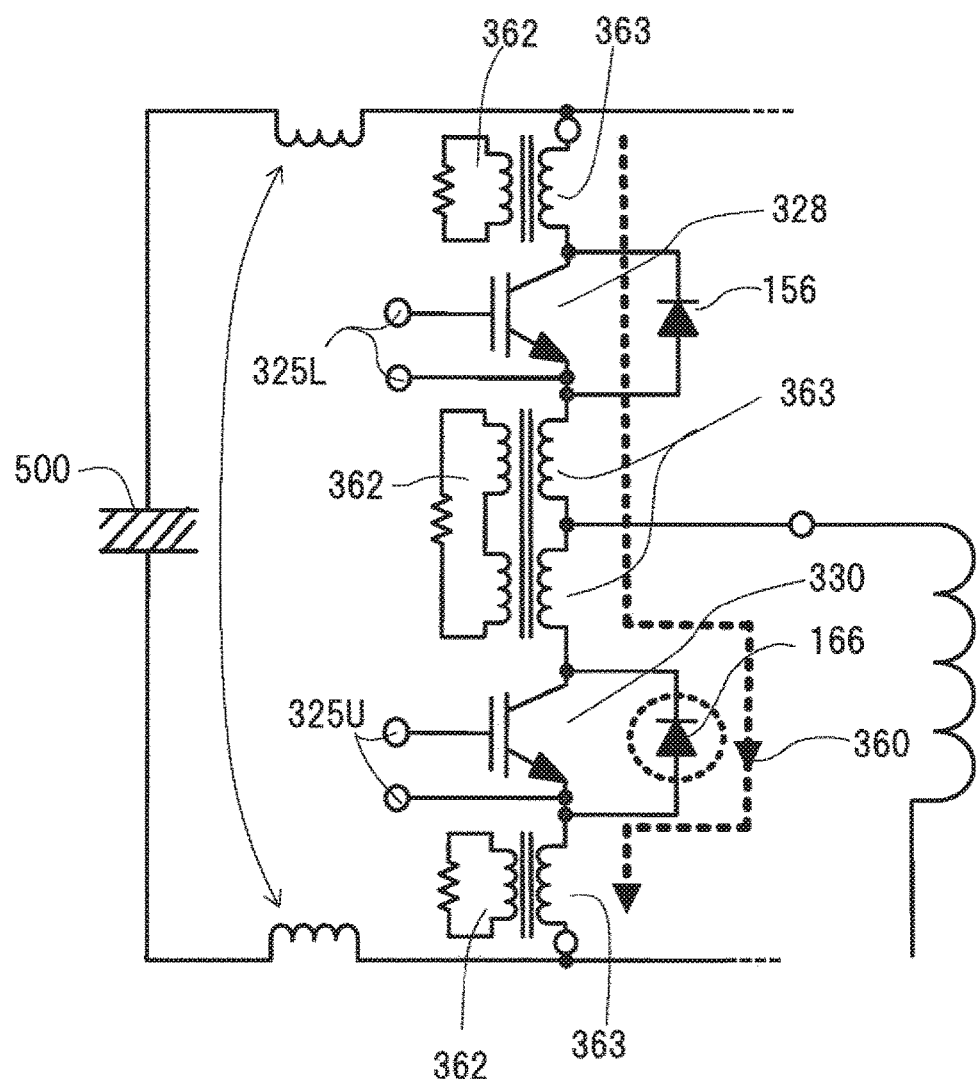
FIG. 20A is a circuit diagram showing an explanatory view of inductance reduction.
Figure 20B:
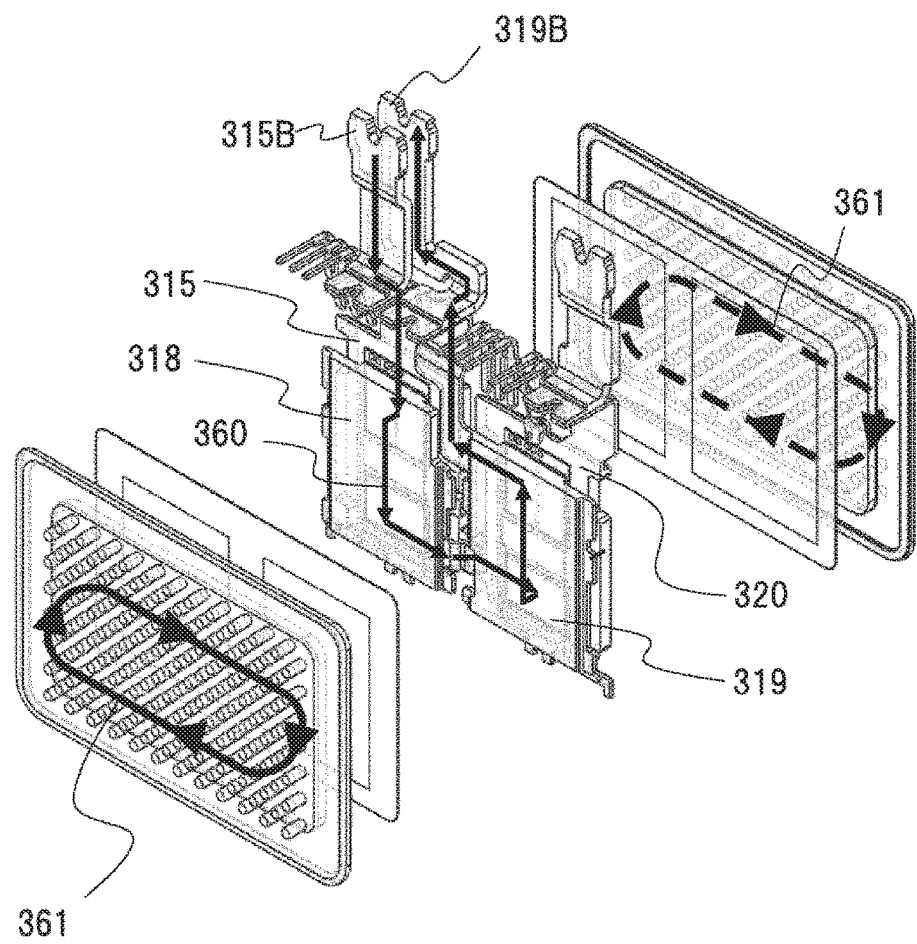
FIG. 20B is an exploded view of the power module showing an explanatory view of inductance reduction.

Inductance reduction in the power module of the present embodiment will be described by using FIG. 20 (a) and FIG. 20 (b). FIG. 20 (a) is a circuit diagram of the power module 300 of the present embodiment. FIG. 20 (b) is an exploded view of the power module 300.

A diode 166 of a lower arm side is caused to be in a state in which it is conductive in a forward bias state. If the upper-arm-side IGBT 328 becomes an ON state in this state, a diode 166 of the lower arm side becomes a reverse bias, and a recovery current caused by carrier migration penetrates through the upper/lower arms. At this point, a recovery current 360 shown in FIG. 20 (b) flows to the conductor plates 315, 3318, 320, and 319. The recovery current 360 flows through a direct-current positive-electrode terminal 315B disposed to be opposed to a direct-current negative-electrode terminal 319B. Subsequently, it flows through a loop-shaped path formed by the conductor plates 315, 318, 320, and 319. Then, it flows to the direct-current negative-electrode terminal 319B.

When the current flows through the loop-shaped path, eddy currents 361 flows to the first heat dissipating surface 307A and the second heat dissipating surface 307B of the cooler 304. Wiring inductance 363 in the loop-shaped path is reduced by the magnetic-field cancelling-out effect generated by equivalent circuits 362 in the current path of the eddy currents 361. Note that, the closer the current path of the recovery current 360 to a loop shape, the more the inductance reducing effect is increased. The inductance can be reduced by the magnetic-field cancelling-out effects by employing the 2-in-1 structure in which the upper arm circuit and the lower arm circuit serving as 1 set are made into a module in this manner. Similar effects can be exerted even when they are increased to 4-in-1 or to 6-in-1.

A power module according to a fourth embodiment will be described by using FIG. 21.

Figure 21:
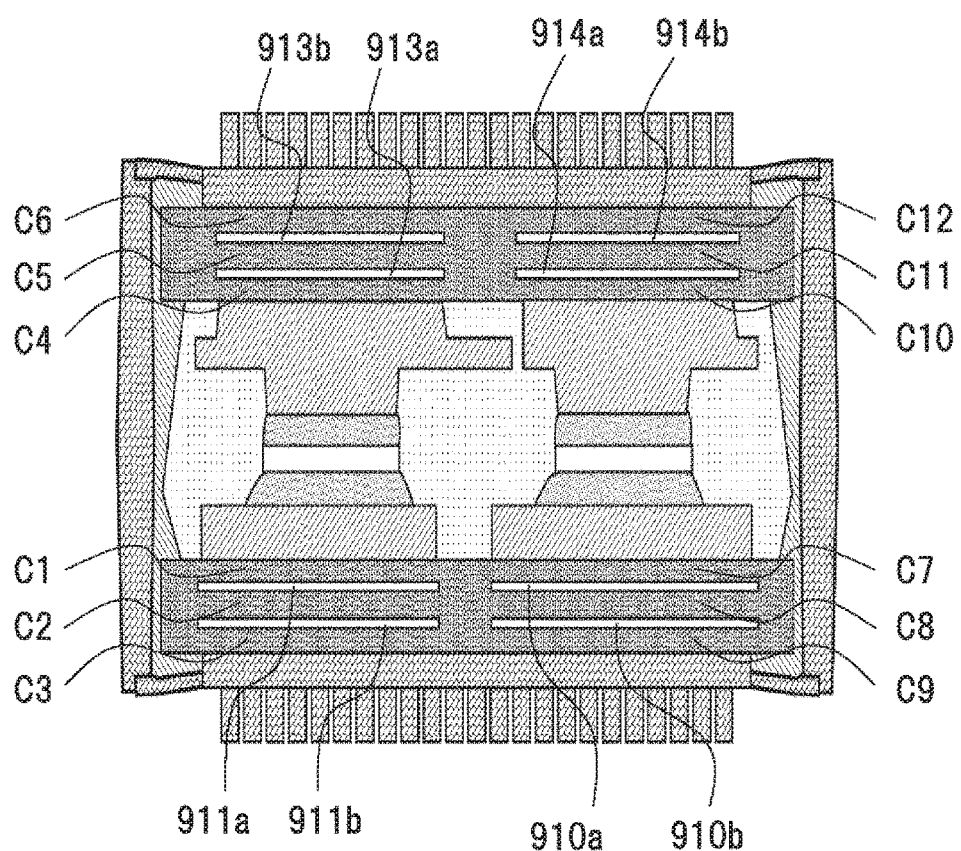
FIG. 21 is a cross-sectional view of a power module of a fourth embodiment.

FIG. 21 is a cross-sectional view of the power module of the present embodiment. This corresponds to FIG. 17 about the power module of the third embodiment. A point changed from the third embodiment is that the number of intermediate conductors is increased.

Intermediate conductors 910a and 910b are disposed between the conductor plate 320 and the heat dissipating surface 307A to which an alternating-current voltage is applied. Intermediate conductors 911a and 911b are disposed between the conductor plate 315 and the heat dissipating surface 307A to which a direct-current voltage is applied. Intermediate conductors 913a and 913b are disposed between the conductor plate 318 and the heat dissipating surface 307B to which an alternating-current voltage is applied. Intermediate conductors 914a and 914b are disposed between the conductor plate 319 and the heat dissipating surface 307B to which a direct-current voltage is applied.

The intermediate conductors form capacity circuits C1 to C12, respectively. The capacity C1 is a capacity between the conductor plate 315 and the intermediate conductor 911a. The capacity C2 is a capacity between the intermediate conductor 911a and the intermediate conductor 911b. The capacity C3 is a capacity between the intermediate conductor 911b and the heat dissipating surface 307A. The capacity C4 is a capacity between the conductor plate 318 and the intermediate conductor 913a. The capacity C5 is a capacity between the intermediate conductor 913a and the intermediate conductor 913b. The capacity C6 is a capacity between the intermediate conductor 913b and the heat dissipating surface 307B. The capacity C7 is a capacity between the conductor plate 320 and the intermediate conductor 910a. The capacity C8 is a capacity between the intermediate conductor 910a and the intermediate conductor 910b. The capacity C9 is a capacity between the intermediate conductor 910b and the heat dissipating surface 307A. The capacity C10 is a capacity between the conductor plate 319 and the intermediate conductor 914a. The capacity C11 is a capacity between the intermediate conductor 914a and the intermediate conductor 914b. The capacity C12 is a capacity between the intermediate conductor 914b and the heat dissipating surface 307B. However, the capacities C1, C2, and C3 between the conductor plate 315 and the heat dissipating surface 307A and C10, C11, and C12 between the conductor plate 319 and the heat dissipating surface 307B to which direct-current voltages are applied form capacity circuits only when the direct-current voltages are varied.

In the power module of the present embodiment, since the voltage applied to the insulating layer can be shared by three, the total thickness of the insulating layer can be further reduced.

Figure 22:
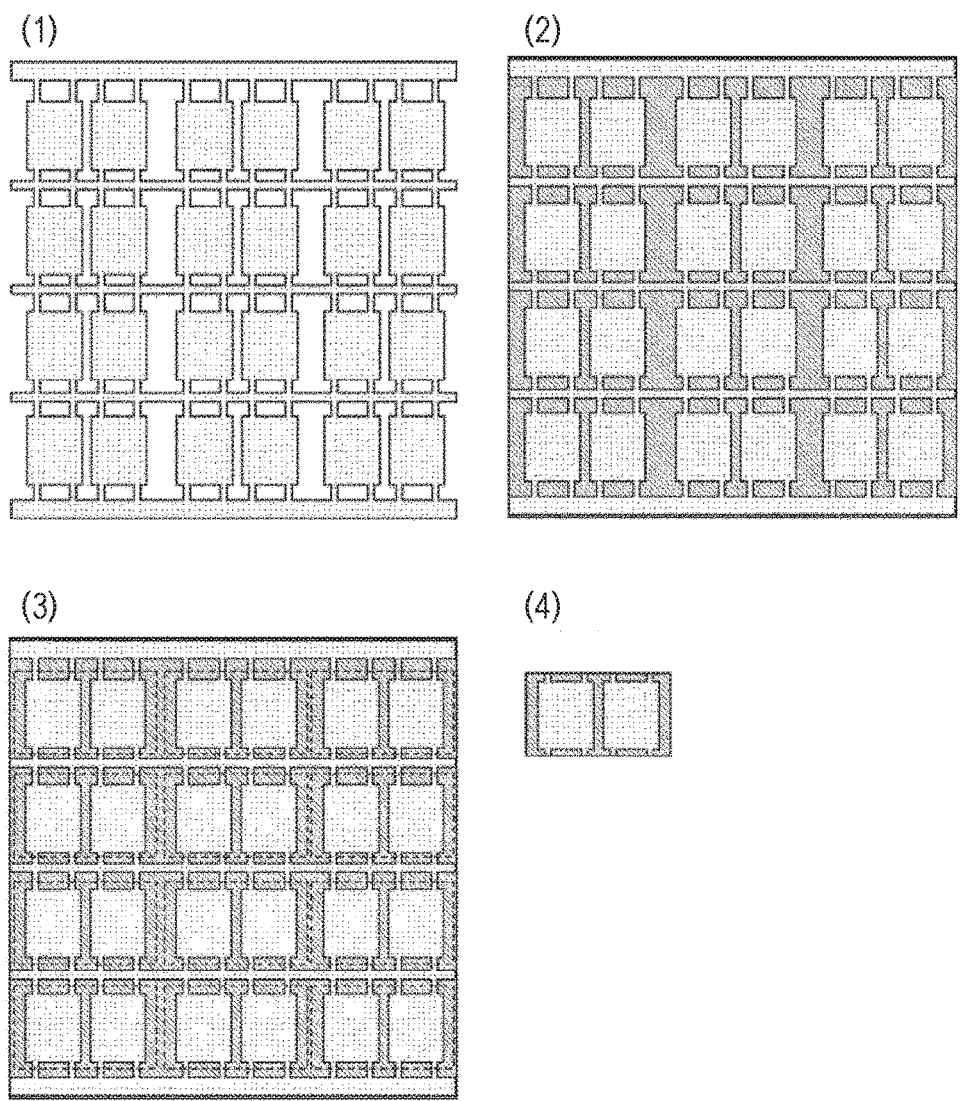
FIG. 22 is a preparation method of insulating layers having intermediate conductors.

FIG. 22 is a diagram showing a procedure of preparing insulating layers having intermediate conductors. (1) Copper foil is punched out by pressing. The thickness of the usable copper foil is, for example, 6 µm. Although the example of copper foil is shown herein, it is not required to be copper foil as long as it is metal foil. (2) Insulating sheets are pressure-bonded to upper/lower surfaces of the copper foil by pressing. (3) The positions to be punched out by a die are set. (4) It is punched out by the die.

When preparation is carried out in such a manner, a plurality of sheets can be collectively prepared. In this case, the cut surfaces of the conductors supporting a plurality of intermediate conductors are exposed from the insulating sheets. When the cut surface from which the conductor is exposed so that the end face thereof is not close to electrodes has allowance in the sheet length with respect to the electrode to be pressure-bonded, discharge from the intermediate conductor end surface can be prevented.

Figure 23:
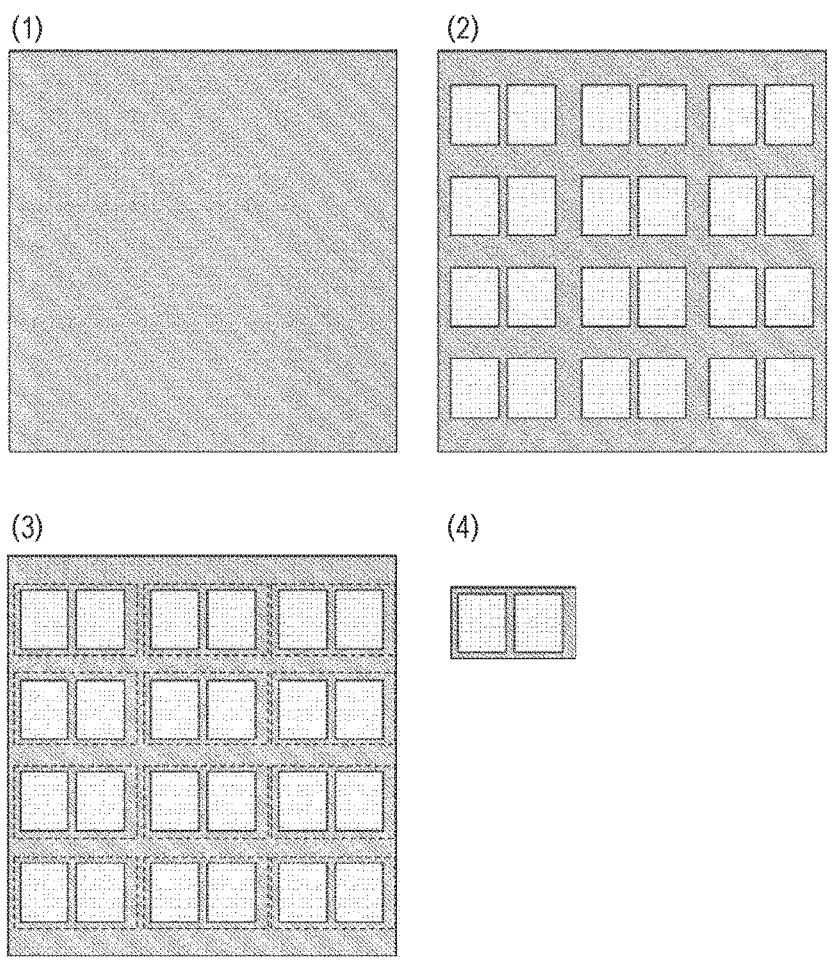
FIG. 23 shows a modification example of the preparation method of the insulating layers having intermediate conductors.

FIG. 23 is a diagram showing a modification example of the procedure of creating insulating layers having intermediate conductors. (1) An insulating sheet is prepared. (2) Aluminum coating is formed on the insulating sheet by aluminum vapor deposition through masking from which intermediate-conductor formation portions are hollowed out. An insulating sheet on which no pattern is formed is pressed thereon so that the aluminum coating formed by the vapor deposition is in the interior thereof. The thickness of the aluminum coating can be, for example, 0.1 µm. Although the example of aluminum vapor deposition is shown herein, it is not required to be aluminum coating as long as it is an electrically-conductive material. Although the example of the vapor deposition is shown herein, a method by printing or the like may be used as long as it is a formation method capable of forming an electrically-conductive material with masking. (3) The positions to be punched out by a die are set. (4) It is punched out by the die.

When preparation is carried out in such a manner, thin intermediate conductors can be formed. When the insulating sheets has the thin intermediate conductor layer, generation of unevenness in the pressure-bonding pressure caused by unevenness of the intermediate conductors when the insulating sheets are pressure-bonded, and an even pressure-bonded surface can be formed.

Figure 24:
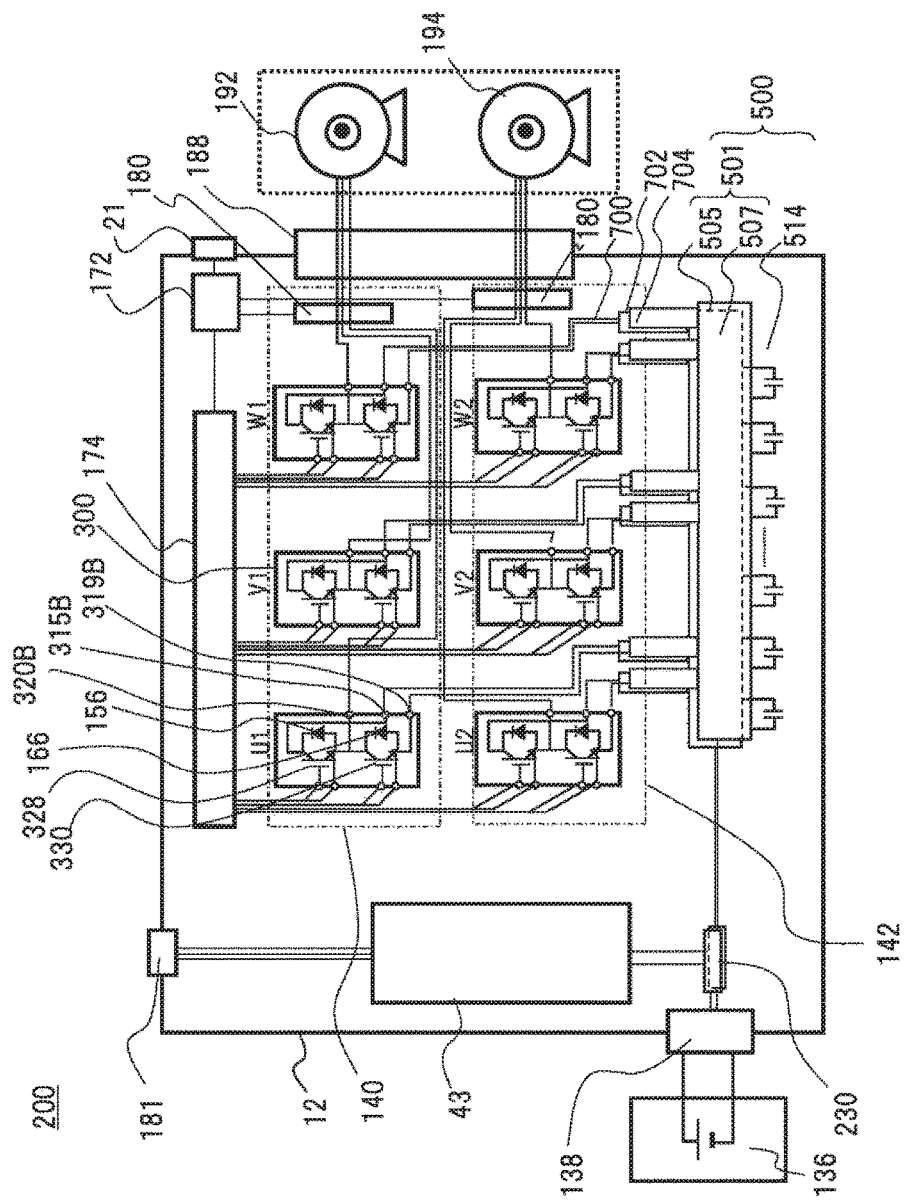
FIG. 24 is a circuit diagram of an electric-power converting device.

Configuration examples of an electric-power converting device and a vehicle system to which the power modules of the present invention are incorporated will be described by using FIG. 24 to FIG. 26. FIG. 24 shows a circuit diagram of the electric-power converting device.

The electric-power converting device 200 is provided with inverter circuit parts 140 and 142, an auxiliary inverter circuit part 43, and a capacitor module 500. The inverter circuit parts 140 and 142 are provided with a plurality of power modules 300 and form 3-phase bridge circuits by connecting them. If the current capacity thereof is large, increase in the current capacity can be supported by further connecting the power modules 300 in parallel and carrying out this parallel connection to support each phase of the 3-phase inverter circuit. Meanwhile, increase in the current capacity can be also supported by parallelly connecting the power semiconductor elements built in the power modules 300.

Basic circuit configurations of the inverter circuit part 140 and the inverter circuit part 142 are the same, and control methods and operations thereof are also basically the same. Herein, the inverter circuit part 140 will be described as a representative example. The inverter circuit part 140 is provided with the 3-phase bridge circuit as a basic configuration. Specifically, respective arm circuits operated as a U-phase (represented by a reference sign U1), a V-phase (represented by a reference sign V1), and a W-phase (represented by a reference sign W1) are connected in parallel to positive-electrode-side and negative-electrode-side conductors, which send direct-current electric power. Note that the respective arm circuits which operate as the U-phase, the V-phase, and the W-phase of the inverter circuit part 142 are represented by reference signs U2, V2, and W2 as well as the case of the inverter circuit part 140.

Each of the arm circuits of the phases is formed by an upper/lower arm series circuit in which an upper arm circuit and a lower arm circuit are connected in series. The upper arm circuit of each phase is connected to a positive-electrode-side conductor, and the lower arm circuit of each phase is connected to a negative-electrode-side conductor. Alternating-current electric power is generated in each connection part of the upper arm circuit and the lower arm circuit. The connection part of the upper arm circuit and the lower arm circuit of each of the upper/lower arm series circuits is connected to the alternating-current terminal 320B of each power module 300. The alternating-current terminal 320B of each of the power module 300 is connected to an alternating-current output terminal of the electric-power converting device 200, and the generated alternating-current electric power is supplied to a stator winding wire of a motor generator 192 or 194. The power modules 300 of the phases basically have the same structures, and operations thereof are also basically the same. Therefore, representatively, the U-phase (U1) of the power module 300 will be described.

The upper arm circuit is provided with the upper-arm IGBT 328 and the upper-arm diode 156 as power semiconductor elements for switching. Moreover, the lower arm circuit is provided with the lower-arm IGBT 330 and the lower-arm diode 166 as power semiconductor elements for switching. The direct-current positive-electrode terminal 315B and the direct-current negative-electrode terminal 319B of each of the upper/lower arm series circuits are connected to capacitor-connecting direct-current terminals of the capacitor module 500. The alternating-current electric power output from the alternating-current terminal 320B is supplied to the motor generators 192 and 194.

The IGBTs 328 and 330 carry out switching operations in response to drive signals, which are output from one or the other one of two driver circuits constituting a driver circuit 174, and convert direct-current electric power, which is supplied from a battery 136, to three-phase alternating-current electric power. The converted electric power is supplied to the stator winding wire of the motor generator 192. Note that, since the V-phase and the W-phase have approximately the same circuit configurations as the U-phase, display of the reference signs 328, 330, 156, and 166 is omitted. The power modules 300 of the inverter circuit part 142 have similar configurations as those of the inverter circuit part 140, and the auxiliary inverter circuit part 43 has similar configuration as the inverter circuit part 142; and description thereof is omitted herein.

The switching power semiconductor elements will be described by using the upper-arm IGBT 328 and the lower-arm IGBT 330. Each of the upper-arm IGBT 328 and the lower-arm IGBT 330 is provided with a collector electrode, an emitter electrode (emitter electrode terminal for signals), and a gate electrode (gate electrode terminal). Between the collector electrode and the emitter electrode of the upper-arm IGBT 328 or the lower-arm IGBT 330, the upper-arm diode 156 or the lower-arm diode 166 is electrically connected as shown in the drawing.

Each of the upper-arm diode 156 and the lower-arm diode 166 is provided with 2 electrodes, i.e., a cathode electrode and an anode electrode. The cathode electrode of the diode 156 or 166 is electrically connected to the collector electrode of the IGBT 328 or 330, and the anode electrode is electrically connected to the emitter electrode of the IGBT 328 or 330 so that the direction from the emitter electrode toward the collector electrode of the upper-arm IGBT 328 or the lower-arm IGBT 330 is the forward direction. Note that as the power semiconductor element, a MOSFET (metal-oxide-semiconductor field-effect transistor) may be used, and, in this case, the upper-arm diode 156 and the lower-arm diode 166 are not necessary.

The temperature information of the upper/lower arm series circuit is input to a microcomputer from a temperature sensor (not shown) provided at the upper/lower arm series circuit. Moreover, the voltage information of the direct-current positive-electrode side of the upper/lower arm series circuit is input to the microcomputer. The microcomputer carries out excess temperature detection and excess voltage detection based on the information; and, if an excess temperature or an excess voltage is detected, the switching operations of all the upper-arm IGBT 328 and the lower-arm IGBT 330 are stopped to protect the upper/lower arm series circuit from the excess temperature or the excess voltage.

Figure 25:
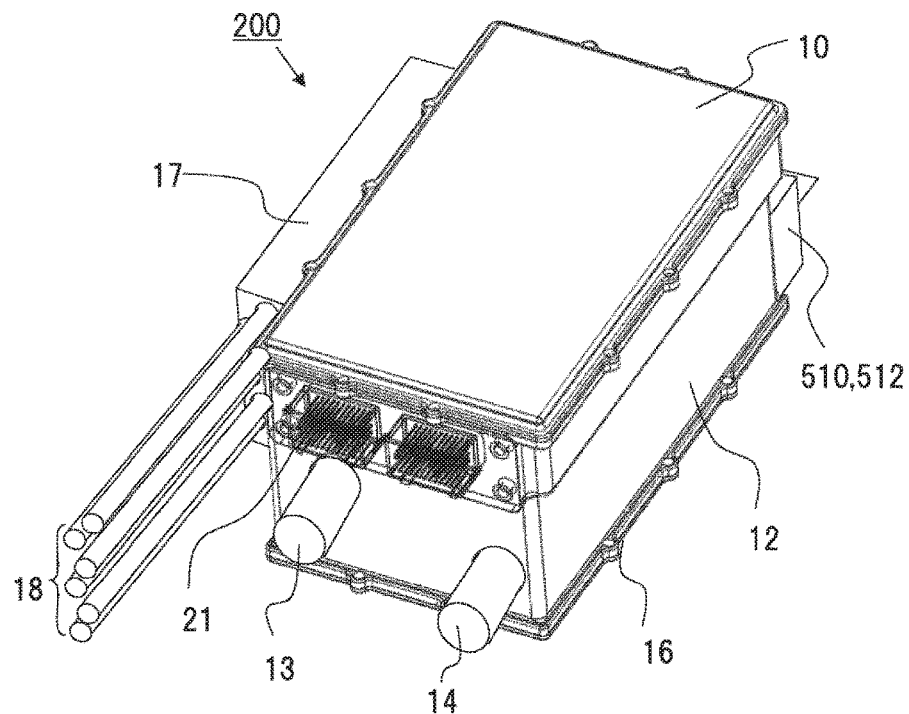
FIG. 25 is a perspective view showing the external appearance of the electric-power converting device.

FIG. 25 is a perspective view showing the external appearance of the electric-power converting device 200. The external appearance of the electric-power changing device 200 according to the present embodiment is formed by fixing a chassis 12 having an approximately rectangular upper surface or bottom surface, an upper-part case 10 provided at one short-side outer periphery of the chassis 12, and a lower-part case 16 for closing a lower-part opening of the chassis 12. Since the shape of a bottom view or a top view of the chassis 12 is an approximately rectangular, attachment to a vehicle is easy, and it is easy to produce.

Figure 26:
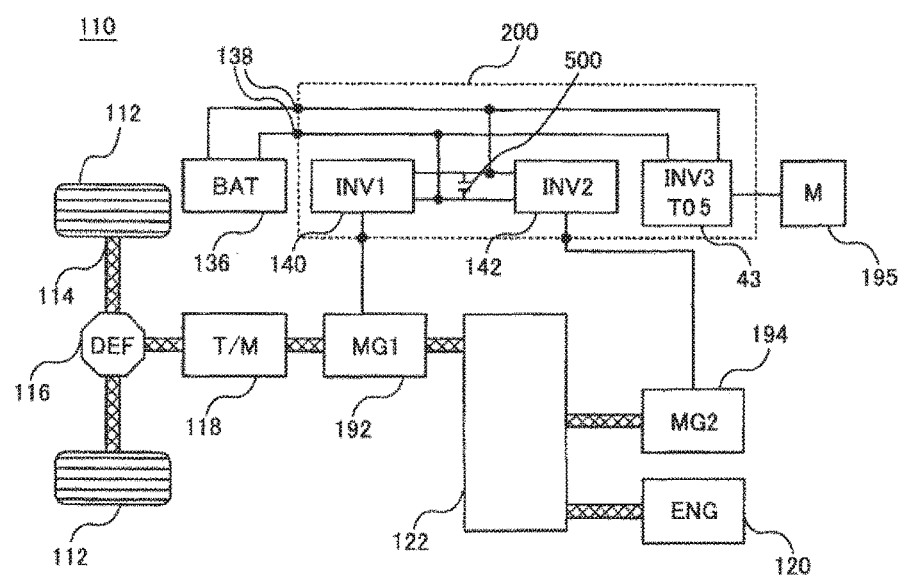
FIG. 26 is a control block diagram of a hybrid automobile.

FIG. 26 shows a control block diagram of a hybrid automobile in which an electric-power converting device is mounted. A hybrid automobile (HEV) 110 is provided with 2 vehicle driving system. One of them is an engine driving system using an engine 120 as a power source, and the other one is a rotating electric machine driving system using the motor generators 192 and 194 as power sources. The electric-power converting device 200 of the present invention carries out electric power conversion of direct currents and alternating currents between the battery 136, the motor generators 192 and 194, and an auxiliary motor 195 and optimally controls supply of driving electric power to the motor and electric power regeneration from the motor depending on the driving state of the vehicle to contribute to improvement of fuel cost.

REFERENCE SIGNS LIST

10 upper-part case
12 chassis
16 lower-part case
18 alternating-current terminal
22 drive circuit board
43 inverter circuit
110 hybrid automobile
112 front wheel
114 front-wheel axle
116 differential gear
118 transmission
120 engine
122 power distributing mechanism
136 battery
138 direct-current connector
140 inverter circuit
142 inverter circuit
156 diode
166 diode
172 control circuit
174 driver circuit
180 current sensor
192 motor generator
194 motor generator
195 motor
200 electric-power converting device
230 input laminated wiring board
300 power module
304 cooling body
304A thin portion of cooling body
304B flange
305 heat dissipating fin
306 insertion opening
307 heat dissipating surface
307A first heat dissipating surface
307B second heat dissipating surface
315 direct-current positive-electrode conductor plate
315B direct-current positive-electrode terminal
319 direct-current negative-electrode conductor plate
319B direct-current negative-electrode terminal
318 conductor plate
320B alternating-current terminal
328 IGBT
330 IGBT
333 insulating sheet
348 first sealing material
350 thick portion of cooling body
351 second sealing material
370 connection part
500 capacitor module
800 electrode
801 intermediate conductor
802 electrode
803 electrode
804 electrode
810 insulating layer
811 insulating layer
850 air layer
851 insulating layer
900 insulating layer
910 alternating-current-side intermediate conductor
911 direct-current-side intermediate conductor
912 alternating-current-side intermediate conductor
913 alternating-current-side intermediate conductor
914 direct-current-side intermediate conductor
1000 curve tracer
1001 transmitter
1002 direct-current power source

The invention claimed is:

1. A power module comprising:
a first power semiconductor element of an upper arm side constituting an inverter circuit configured to convert a direct current to an alternating current;
a second power semiconductor element of a lower arm side constituting the inverter circuit;
a first conductor part electrically connected to the first power semiconductor element and configured to transmit the direct current;
a second conductor part electrically connected to the second power semiconductor element and configured to transmit the alternating current;
an electrically-conductive first heat dissipating part disposed in an opposite side of the second power semiconductor element with the second conductor part interposed therebetween; and
a intermediate conductor layer disposed between the first heat dissipating part and the second conductor part, wherein
an insulating layer is disposed between the intermediate conductor layer and the second conductor part and between the intermediate conductor layer and the first heat dissipating part.

2. The power module according to claim 1, wherein
the first conductor part is disposed between the first power semiconductor element and the first heat dissipating part, and
the intermediate conductor layer is provided so that, when projection is carried out along an arrangement direction of the second conductor part and the intermediate conductor layer, a projected part of the intermediate conductor layer is not overlapped with a projected part of the first conductor part.

3. The power module according to claim 1, wherein
the first conductor part is disposed between the first power semiconductor element and the first heat dissipating part,
the intermediate conductor layer includes a first intermediate conductor layer disposed between the first heat dissipating part and the first conductor part and second intermediate conductor layer disposed between the first heat dissipating part and the second conductor part, and
the second intermediate conductor layer is formed to be separated from the first intermediate conductor layer.

4. The power module according to claim 3, comprising
a third conductor part electrically connected to the second conductor part, wherein
the intermediate conductor layer further includes a third intermediate conductor layer disposed between the first heat dissipating part and the third conductor part,
an insulating layer is disposed between the third intermediate conductor layer and the third conductor part and between the third intermediate conductor layer and the first heat dissipating part, and
the third intermediate conductor layer is formed to be separated from the first intermediate conductor layer.

5. The power module according to claim 3, wherein
the second intermediate conductor layer is provided so that, when projection is carried out along an arrangement direction of the second conductor part and the second intermediate conductor layer, a projected part of the second conductor part is included in a projected part of the second intermediate conductor layer.

6. The power module according to claim 1, wherein
a plurality of the intermediate conductor layers are provided along an arrangement direction of the second conductor part and the intermediate conductor layer.

7. The power module according to claim 1, comprising:
a third conductor part disposed in an opposite side of the first conductor part with the first power semiconductor element interposed therebetween and electrically connected to the first power semiconductor element;
a fourth conductor part disposed in an opposite side of the second conductor part with the second power semiconductor element interposed therebetween and electrically connected to the second power semiconductor element;
an electrically-conductive second heat dissipating part disposed in an opposite side of the first power semiconductor element with the third conductor part interposed therebetween; and
a third intermediate conductor layer disposed between the second heat dissipating part and the third conductor part, wherein
the third conductor part is electrically connected to the second conductor part,
an insulating layer is disposed between the third intermediate conductor layer and the third conductor part and between the third intermediate conductor layer and the second heat dissipating part.

8. The power module according to claim 7, wherein
the fourth conductor part is disposed between the second power semiconductor element and the second heat dissipating part, and
a fourth intermediate conductor layer is provided between the second heat dissipating part and the fourth conductor part, and
the third intermediate conductor layer is formed to be separated from the fourth intermediate conductor layer.

9. The power module according to claim 8, wherein
the third intermediate conductor layer is provided so that, when projection is carried out along an arrangement direction of the third conductor part and the third intermediate conductor layer, a projected part of the third conductor part is included in a projected part of the third intermediate conductor layer.

10. The power module according to claim 7, wherein
a plurality of the third intermediate conductor layers are provided along an arrangement direction of the third conductor part and the third intermediate conductor layer.

11. The power module according to claim 1, wherein
the intermediate conductor layer is metal foil formed on the insulating layer.

12. The power module according to claim 1, wherein
the intermediate conductor layer is a vapor deposited matter of an electrically-conductive material formed on the insulating layer.

13. The power module according to claim 1, wherein
the intermediate conductor layer is a printed matter of an electrically-conductive material formed on the insulating layer.

14. An electric-power converting device using a power module according to claim 1.

* * * * *